United States Patent
Shin et al.

(10) Patent No.: US 11,127,797 B2
(45) Date of Patent: Sep. 21, 2021

(54) FOLDABLE DISPLAY DEVICE

(71) Applicant: Samsung Display Co., Ltd., Yongin-si (KR)

(72) Inventors: Jai Ku Shin, Hwaseong-si (KR); Dong Jin Park, Seongnam-si (KR); Dong Woo Seo, Suwon-si (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/859,834

(22) Filed: Apr. 27, 2020

(65) Prior Publication Data

US 2021/0111230 A1   Apr. 15, 2021

(30) Foreign Application Priority Data

Oct. 15, 2019 (KR) .......................... 10-2019-0127429

(51) Int. Cl.
*H01L 27/32* (2006.01)
*H01L 51/00* (2006.01)
*H01L 51/52* (2006.01)

(52) U.S. Cl.
CPC ........ *H01L 27/3234* (2013.01); *H01L 27/323* (2013.01); *H01L 27/3244* (2013.01); *H01L 51/0097* (2013.01); *H01L 51/524* (2013.01); *H01L 51/5281* (2013.01); *H01L 2251/5338* (2013.01)

(58) Field of Classification Search
CPC ............... H01L 27/3234; H01L 27/323; H01L 27/3244; H01L 51/0097; H01L 51/524; H01L 51/5281; H01L 2251/5338
See application file for complete search history.

(56) References Cited

U.S. PATENT DOCUMENTS

| | | | |
|---|---|---|---|
| 10,541,380 B1* | 1/2020 | Sung | H01L 21/76205 |
| 10,873,053 B2* | 12/2020 | Sung | H01L 21/76205 |
| 10,923,552 B2* | 2/2021 | Choi | H01L 27/3276 |
| 2016/0163282 A1 | 6/2016 | Hsieh et al. | |
| 2019/0123218 A1 | 4/2019 | Min | |
| 2020/0133415 A1* | 4/2020 | Choi | G06F 3/044 |
| 2020/0174295 A1* | 6/2020 | Baek | G02F 1/1339 |
| 2020/0176539 A1* | 6/2020 | Sung | H01L 27/3276 |
| 2021/0055817 A1* | 2/2021 | Shin | G06K 9/00 |
| 2021/0066408 A1* | 3/2021 | Wu | H01L 51/5275 |

FOREIGN PATENT DOCUMENTS

| | | |
|---|---|---|
| EP | 3226101 A1 | 10/2017 |
| KR | 10-2017-0084402 A | 7/2017 |
| KR | 10-2018-0038606 A | 4/2018 |

* cited by examiner

*Primary Examiner* — Ida M Soward
(74) *Attorney, Agent, or Firm* — Lewis Roca Rothgerber Christie LLP

(57) ABSTRACT

A display device including: a sensor device; a display module to display an image and having a first through-hole in which the sensor device is positioned; and a bottom panel cover on one surface of the display module and having a second through-hole in which the sensor device is positioned. The first through-hole has breadth that increases from the one surface of the display module toward another surface of the display module opposite to the one surface of the display module.

21 Claims, 28 Drawing Sheets

FOLDABLE DISPLAY DEVICE

CROSS-REFERENCE TO RELATED APPLICATION

This application claims priority to and the benefit of Korean Patent Application No. 10-2019-0127429, filed on Oct. 15, 2019, in the Korean Intellectual Property Office, the entire content of which is hereby incorporated by reference.

BACKGROUND

1. Field

Aspects of the present disclosure relate to a foldable display device.

2. Description of the Related Art

As the information society develops, the demand for a display device to display an image in various forms is increasing. For example, display devices are applied to various suitable electronic devices such as smart phones, digital cameras, notebook computers, navigation devices, and smart televisions.

As the display devices are applied to various suitable electronic devices, display devices having various suitable functions and designs are required. For example, in order to widen a display area, a display device is released, in which the display device includes a through-hole in the display area and an optical sensor such as a camera sensor or an infrared sensor is disposed in the through-hole of the display device. Further, in order to increase the portability of the display device and to provide a wide display screen, a bendable display device that may bend the display area or a foldable display device that may fold the display area is released.

However, when the foldable display device is folded or unfolded, components such as display panels and films of the foldable display device may be stressed. When a through-hole is formed in the foldable display device, an amount of slip of the component of the foldable display device in the through-hole may be different. Due to the slip of the components of the foldable display device, interference may occur between an optical sensor disposed in the through-hole and the component of the foldable display device. Alternatively, a size of the through-hole may be increased to prevent or reduce the interference between the optical sensor disposed in the through-hole and the component of the foldable display device due to the slip.

SUMMARY

Aspects of example embodiments of the present disclosure are directed toward a foldable display device capable of preventing or reducing interference between an optical sensor disposed in a through-hole and a component due to slip of the component, without increasing a size of the through-hole.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a display device including: a sensor device; a display module to display an image and having a first through-hole in which the sensor device is positioned; and a bottom panel cover on one surface of the display module and having a second through-hole in which the sensor device is positioned. The first through-hole has breadth that increases from the one surface of the display module toward another surface of the display module opposite to the one surface of the display module.

According to some example embodiments of the present disclosure, there is provided a display device including: a sensor device; and a display module having a first through-hole in which the sensor device is positioned. The first through-hole has breadth that increases from one surface of the display module toward another surface of the display module. A first portion of the one surface of the display module faces a second portion of the one surface of the display module when the display module is folded.

According to the aforementioned and other example embodiments of the present disclosure, it is possible to prevent or reduce interference between components of the display device and a sensor device when a first through-hole widens (e.g., has breadth that increases) from one surface of a display module facing a bottom panel cover toward another surface of the display module facing a cover window, even if the display device is folded in an out-folding state, and thus causing a protective film, a display panel, a polarizing film, and a buffer layer of the display module to slip.

Moreover, it is possible to prevent or reduce interference between components of the display device and a sensor device when a first through-hole widens (e.g., has breadth that increases) from the other surface of a display module facing a cover window toward the one surface of the display module facing a bottom panel cover, even if the display device is folded in an in-folding state, and thus causing a protective film, a display panel, a polarizing film, and a buffer layer of the display module to slip.

Other aspects and example embodiments may be apparent from the following detailed description, the drawings, and the claims and equivalents thereof.

BRIEF DESCRIPTION OF THE DRAWINGS

The above and other example embodiments and features of the present disclosure will become more apparent by describing example embodiments thereof with reference to the attached drawings, in which.

DETAILED DESCRIPTION

The present disclosure will now be described more fully hereinafter with reference to the accompanying drawings, in which some embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions may be exaggerated for clarity.

Herein, the use of the term "may," when describing embodiments of the present disclosure, refers to "one or more embodiments of the present disclosure." As used herein, the term "and/or" includes any and all combinations of one or more of the associated listed items. As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. As used herein, the term "substantially," "about," and similar terms are used as terms of approximation and not as terms of degree, and are intended to account for the inherent deviations in measured or calculated values that would be recognized by those of ordinary skill in the art.

Hereinafter, embodiments of the present disclosure will be described with reference to the attached drawings.

A foldable display device 10 according to embodiments herein may be applied to a smartphone, but it is not limited thereto. For example, the foldable display device 10 according to embodiments herein may be applied to mobile phones, tablet PCs, personal digital assistants (PDA), portable multimedia players (PMP), televisions, game machines, wristwatch type electronic devices (e.g., wristwatch-based electronic devices), head mounted displays, monitors of personal computers, laptop computers, car navigation systems, car dashboards, digital cameras, camcorders, external billboards, billboards, medical devices, inspection devices, various suitable home appliances like refrigerators and washing machines, or internet of things devices. Hereinafter, some embodiments will be described with reference to the accompanying drawings.

Figure 1:
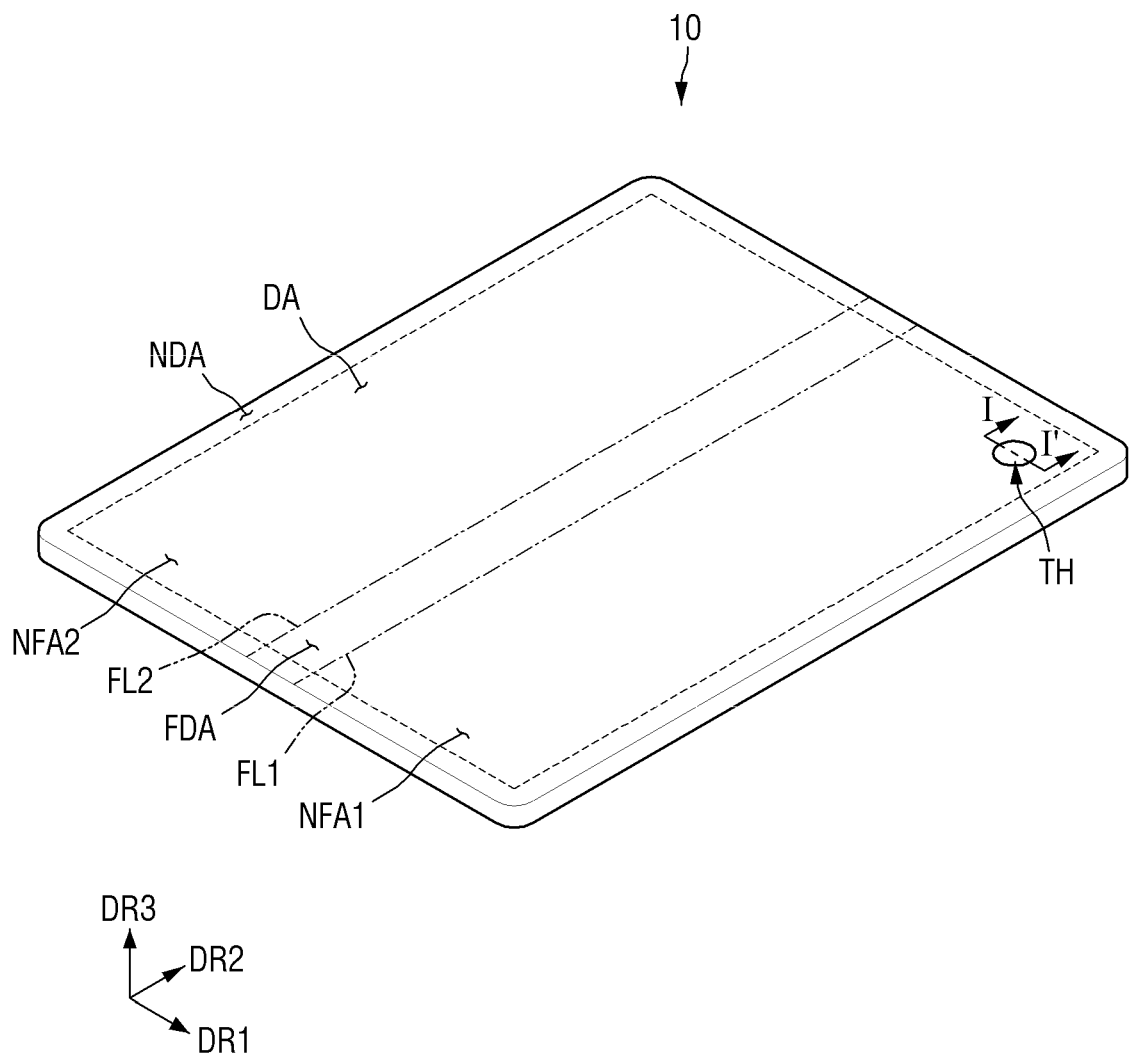
FIG. 1 is a perspective view illustrating a foldable display device in an unfolded state according to an embodiment.
Figure 2:
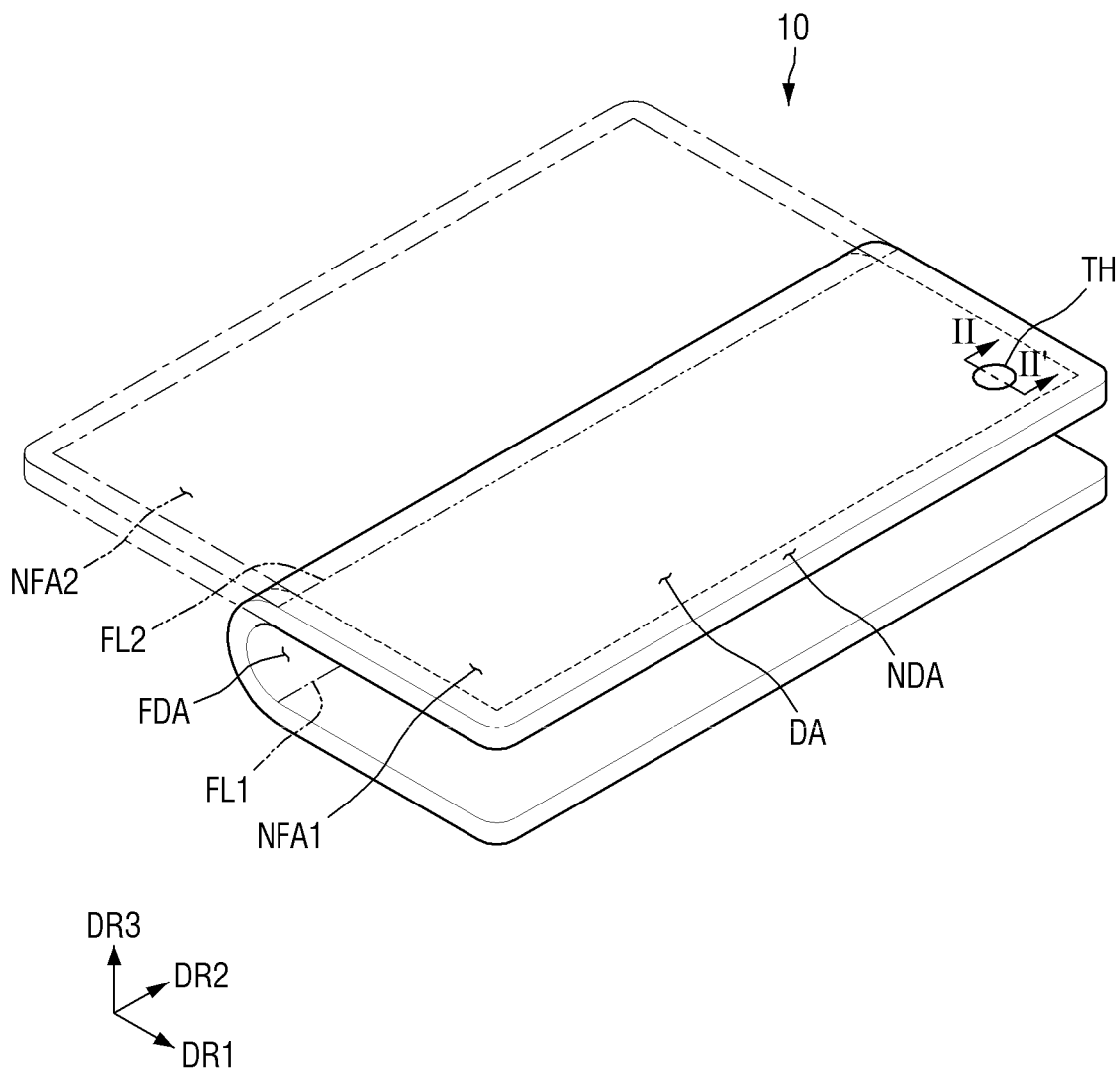
FIG. 2 is a perspective view illustrating a foldable display device in a folded state according to an embodiment.

FIG. 1 is a perspective view illustrating a foldable display device in an unfolded state according to an embodiment. FIG. 2 is a perspective view illustrating a foldable display device in a folded state according to an embodiment.

In FIGS. 1 and 2, a first direction DR1 may be parallel (e.g., substantially parallel) to one side of the foldable display device 10 when viewed on a plane, for example, a horizontal or width direction of the foldable display device 10. A second direction DR2 may be parallel (e.g., substantially parallel) to another side of the foldable display device 10 when viewed on a plane, and it may be a vertical or length direction of the foldable display device 10. A third direction DR3 may be a thickness direction of the foldable display device 10.

The foldable display device 10 may have a rectangular or square shape when viewed on a plane. The foldable display device 10 may have a rectangular shape in which corners are vertical (e.g., in which the corners form right angles) when viewed on a plane, or a rectangular shape in which corners are round. The foldable display device 10 may include two short sides disposed in the first direction DR1 and two long sides disposed in the second direction DR2 when viewed on a plane.

The foldable display device 10 includes a display area DA and a non-display area NDA. A shape of the display area DA may correspond to a shape of the foldable display device 10 when viewed on a plane. For example, if the foldable display device 10 is rectangular when viewed on a plane, the display area DA may also be rectangular.

The display area DA may be an area to display an image (e.g., an area from which an image may be displayed) and may include a plurality of pixels. The plurality of pixels may be arranged in a matrix direction (e.g., a matrix pattern). The plurality of pixels may be rectangular, rhombus, or square when viewed on a plane, but they are not limited thereto. For example, the plurality of pixels may be a quadrangle other than a rectangle, rhombus, or square; a polygon other than a rectangle; a circle; or an oval when viewed on a plane.

The non-display area NDA may be an area that does not include pixels and does not display an image. The non-display area NDA may be disposed around the display area DA. The non-display area NDA may be disposed to surround the display area DA as illustrated in FIGS. 1 and 2, but it is not limited thereto. The display area DA may be partially surrounded by the non-display area NDA.

The foldable display device 10 may include at least one through-hole TH. The through-hole TH may be disposed in the display area DA. The through-hole TH may be disposed to be surrounded by the display area DA as illustrated in FIGS. 1 and 2, but it is not limited thereto. The through-hole TH may be partially surrounded by the display area DA. For example, a portion of the through-hole TH may be surrounded by the display area DA, and the other part may be surrounded by the non-display area NDA.

The through-hole TH may be a circle (e.g., may have a circle shape) when viewed on a plane as shown in FIGS. 1 and 2, but it is not limited thereto. The through-hole TH may be any suitable shape, such as an oval or polygonal shape.

FIGS. 1 and 2 illustrate that the foldable display device 10 includes one through-hole TH, but it is not limited thereto. The foldable display device 10 may include a plurality of through-holes TH.

A sensor device (SED of FIG. 6) may be disposed in the through-hole TH. The sensor device may be a sensor that senses light through the through-hole TH, such as a camera sensor, an illuminance sensor, a proximity sensor, or the like.

The foldable display device 10 may maintain both (e.g., may be configured to be able to transition between) a folded state and an unfolded state. As shown in FIG. 2, the foldable display device 10 may be folded in an out-folding manner in which the display area DA is disposed outside. For example, in some embodiments, when the display device 10 is folded in the out-folding manner, an upper surface of the display device 10, which displays an image, may face outwardly, and a first portion of the upper surface may face away from a second portion of the upper surface. When the foldable display device 10 is folded in the out-folding manner, lower surfaces of the foldable display device 10 may be disposed to face each other. For example, in some embodiments, when the display device 10 is folded in the out-folding manner, a bottom surface of the display device 10, which does not display an image, may face inwardly, and a first portion of the bottom surface may face a second portion of the bottom surface.

The foldable display device 10 may include a folding area FDA, a first non-folding area NFA1, and a second non-folding area NFA2. The folding area FDA may be an area where the foldable display device 10 is folded (e.g., bent or curved), and the first non-folding area NFA1 and the second non-folding area NFA2 may be areas where the foldable display device 10 is not folded. For example, the first and second non-folding areas NFA1 and NFA2, respectively, may be flat (e.g., substantially flat) even when the display device 10 is in a folded state.

The first non-folding area NFA1 may be disposed on one side, for example, a right side of the folding area FDA. The second non-folding area NFA2 may be disposed on the other side, for example, a left side of the folding area FDA. The folding area FDA may be an area bent at a predetermined or set curvature between a first folding line FL1 and a second folding line FL2. For example, the folding area FDA may extend from the first folding line FL1 to the second folding line FL2 along a connecting plane. When the foldable display device 10 is in the unfolded state, the connecting plane may be flat. When the foldable display device 10 is in the folded state, the connecting plane may have a predetermined or set curvature. Therefore, the first folding line FL1 may be a boundary of the folding area FDA and the first non-folding area NFA1, and the second folding line FL2 may be a boundary of the folding area FDA and the second non-folding area NFA2.

The first folding line FL1 and the second folding line FL2 may extend in the second direction DR2 as shown in FIGS. 1 and 2, and the foldable display device 10 may be folded in the first direction DR1. Thus, because a length of the first direction DR1 of the foldable display device 10 may be reduced to about half, it may be convenient for a user to carry the foldable display device 10 in the folded state.

An extending direction of the first folding line FL1 and an extending direction of the second folding line FL2 are not limited to the second direction DR2. For example, the first folding line FL1 and the second folding line FL2 may extend in the first direction DR1, and the foldable display device 10 may be folded in the second direction DR2. In this case, a length of the second direction DR2 of the foldable display device 10 may be reduced to about half. In some embodiments, the first folding line FL1 and the second folding line FL2 may extend in a diagonal direction of the foldable display device 10 corresponding to a direction between the first direction DR1 and the second direction DR2. In this case, the foldable display device 10 may be folded in a triangular form (e.g., shape).

When the first folding line FL1 and the second folding line FL2 extend in the second direction DR2 as shown in FIGS. 1 and 2, the length of the first direction DR1 of the folding area FDA (e.g., the length of the folding area FDA along the first direction DR1) may be shorter (e.g., less) than the length of the second direction DR2 (e.g., the length of the folding area FDA along the second direction DR2). In addition, a length of the first direction DR1 of the first non-folding area NFA1 (e.g., the length of the first non-folding area NFA1 along the first direction DR1) may be longer (e.g., greater) than the length of the first direction DR1 of the folding area FDA (e.g., the length of the folding area FDA along the first direction DR1). A length of the first direction DR1 of the second non-folding area NFA2 (e.g., the length of the non-folding area NFA2 along the first direction DR1) may be longer (e.g., greater) than the length of the first direction DR1 of the folding area FDA (e.g., the length of the folding area FDA along the first direction DR1).

FIGS. 1 and 2 illustrate that each of the display area DA and the non-display area NDA overlaps the folding area FDA, the first non-folding area NFA1, and the second non-folding area NFA2, but it is not limited thereto. For example, each of the display area DA and the non-display area NDA may overlap at least one selected from the folding area FDA, the first non-folding area NFA1, and the second non-folding area NFA2.

The through-hole TH is illustrated to be disposed in the first non-folding area NFA1, but it is not limited thereto. The through-hole TH may be disposed in at least one selected from the first non-folding area NFA1 and the second non-folding area NFA2.

Figure 3:
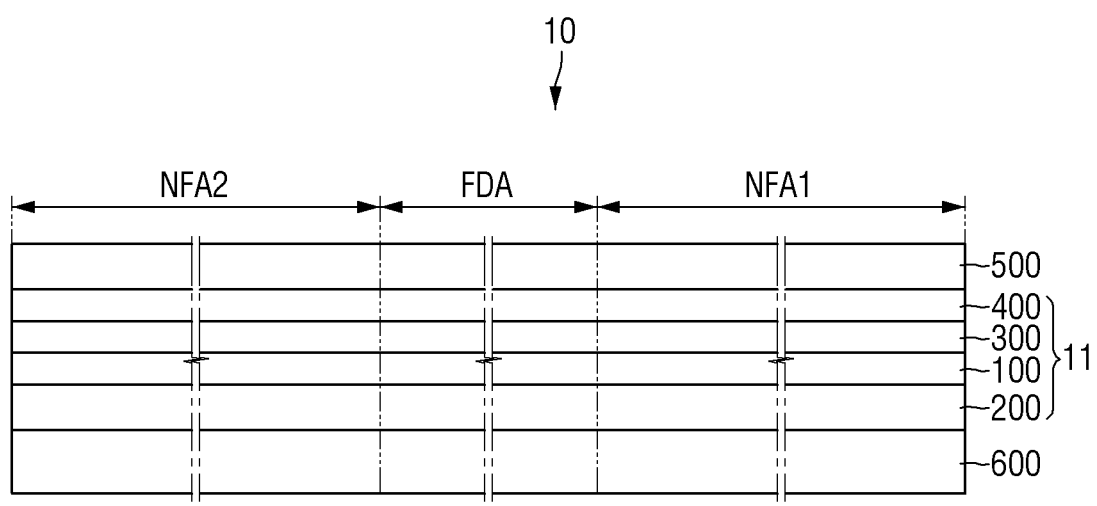
FIG. 3 is a side view illustrating a foldable display device in an unfolded state according to an embodiment.
Figure 4:
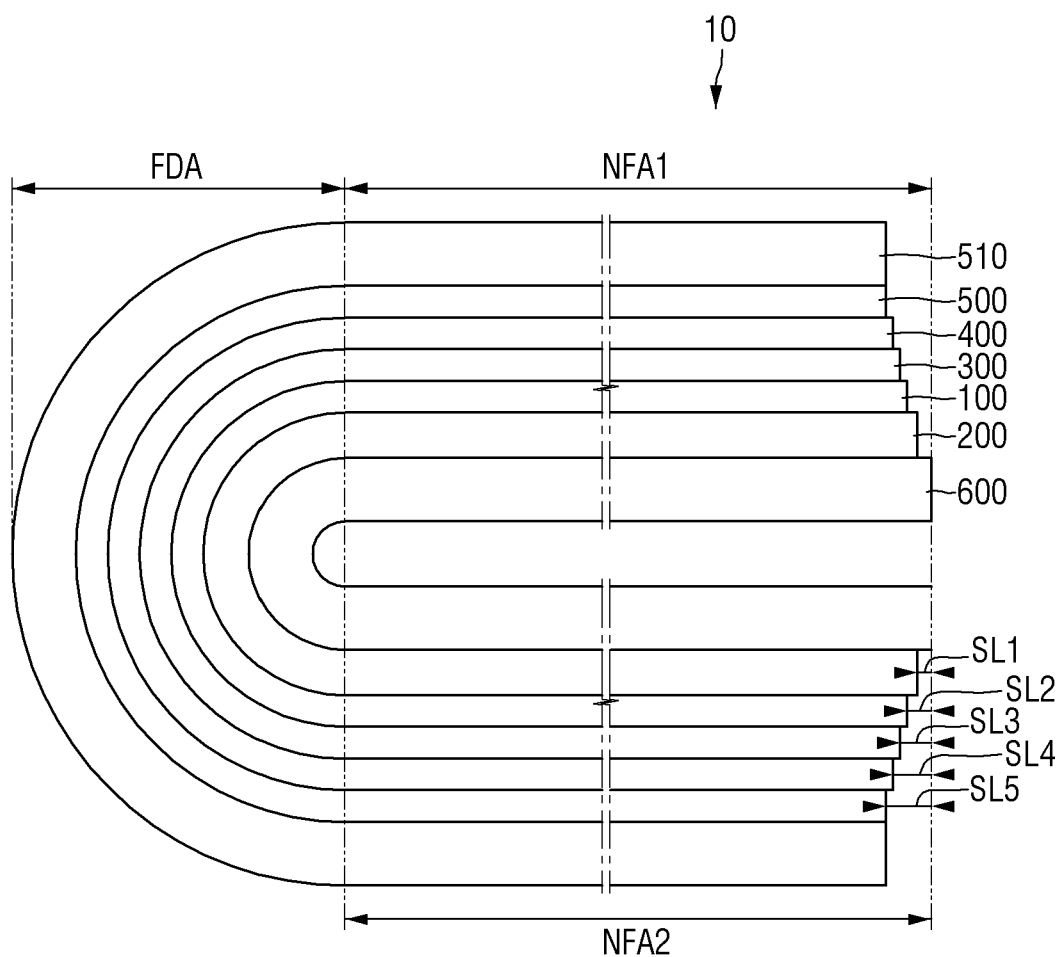
FIG. 4 is a side view illustrating a foldable display device in a folded state according to an embodiment.

FIG. 3 is a side view illustrating a foldable display device in an unfolded state according to an embodiment. FIG. 4 is a side view illustrating a foldable display device in a folded state according to an embodiment.

Referring to FIGS. 3 and 4, the foldable display device 10 may include a display module 11, a cover window 500, a window protective film 510, and a bottom panel cover 600.

The cover window 500 may be disposed on one surface of the display module 11. For example, the one surface of the display module 11 may be an upper surface of the display module 11. The cover window 500 protects the display module 11 by covering the one surface of the display module 11. The cover window 500 may include (e.g., be made of) a transparent material and may include (e.g., be), for example, glass and/or plastic. When the cover window 500 includes (e.g., is) glass, the glass may be Ultra Thin Glass (UTG) having a thickness of 0.1 mm or less. When the cover window 500 includes (e.g., is) plastic, the plastic may be a transparent polyimide film, but it is not limited thereto.

The window protective film 510 may be disposed on one surface of the cover window 500. The one surface of the cover window 500 may be an upper surface of the cover window 500. The window protective film 510 may perform at least one selected from scattering prevention or reduction, impact absorbing, nailing prevention or reduction, fingerprint prevention or reduction, and anti-glare of the cover window 500.

The bottom panel cover 600 may be disposed on the other surface of the display module 11, which is an opposite surface of the one surface of the display module 11. The other surface of the display module 11 may be a lower surface of the display module 11. FIGS. 3 and 4 illustrate that the bottom panel cover 600 is disposed in the folding area FDA, but it is not limited thereto. For example, the bottom panel cover 600 may be removed from the folding area FDA to smoothly fold the display device 10 (e.g., so that the display device 10 may be smoothly folded when in the folded state).

The bottom panel cover 600 may include at least one selected from a light blocking member for absorbing light incident from the outside, a cushion member for absorbing impact from the outside, and a heat dissipation member for efficiently dissipating heat of the display panel 100.

The light blocking member may be disposed on a lower portion of the display panel 100 (e.g., on a lower portion of the display module 11). The light blocking member prevents or reduces the occurrence of light from being transmitted through the light blocking member. The light blocking member may prevent or block components disposed on a lower portion of the light blocking member from being viewed from above the display panel 100, or the light blocking member may reduce the visibility of such components from above the display panel 100. The light blocking member may include (e.g., be) a light absorbing material such as a black pigment, a black dye, and/or the like.

The cushion member may be disposed on a lower portion of the light blocking member. The cushion member absorbs external impact to prevent or reduce the occurrence of damage to the display panel 100. The cushion member may include (e.g., consist of) a single layer or a plurality of layers. For example, the cushion member may be formed of a polymer resin such as polyurethane, polycarbonate, polypropylene, polyethylene, and/or the like, or it may include (e.g., be) elastic materials such as rubber, urethane-based materials, and/or sponges foamed with acrylic-based materials.

The heat dissipation member may be disposed on a lower portion of the cushion member. The heat dissipation member may include a first heat dissipation layer containing graphite, carbon nanotube, and/or the like, and a second heat dissipation layer formed of a thin metal film such as copper, nickel, ferrite, and/or silver that has excellent thermal conductivity and that may shield, block, or reflect electromagnetic waves.

The display module 11 may include the display panel 100, a protective film 200, a polarizing film 300, and a buffer layer 400.

The display panel 100 is a panel to display an image. Examples of the display panel 100 may include an organic light emitting display panel utilizing an organic light emitting diode, a quantum dot light emitting display panel including a quantum dot emitting layer, an inorganic light emitting display panel including an inorganic semiconductor, and a micro light emitting display panel utilizing a micro light emitting diode (LED). Hereinafter, the display panel 100 will be described as an organic light emitting display panel, but it is not limited thereto. A more detailed description of the display panel 100 will be provided herein below with reference to FIG. 9.

The protective film 200 may be disposed on one surface of the display panel 100. The one surface of the display panel 100 may be a lower surface of the display panel 100. FIGS. 3 and 4 illustrate that the protective film 200 is disposed in the folding area FDA, but it is not limited thereto. For example, the protective film 200 may be removed from the folding area FDA to smoothly fold the display device 10 (e.g., so that the display device 10 may be smoothly folded when in the folded state). The protective film 200 may be a polymer film layer. For example, the protective film 200 may contain polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), and/or cycloolefin polymer (COP).

The polarizing film 300 may be disposed on the other surface (e.g., upper surface of the display panel 100), which is the opposite surface of the one surface of the display panel 100. The other surface of the polarizing film 300 may be an upper surface of the display panel 100. For example, one surface of the polarizing film 300 may be an upper surface of the polarizing film 300, and another surface of the polarizing film 300 may be a lower surface of the polarizing film 300 that is disposed on the upper surface of the display panel 100. The polarizing film 300 may include a linear polarizing plate, and a phase delay film such as a λ/4 plate (quarter-wave plate). In this case, the phase delay film may be disposed on the display panel 100, and the linear polarizing plate may be disposed on the phase delay film.

The buffer layer 400 may increase durability of the cover window 500 and may improve optical performance. The buffer layer 400 may contain polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), and/or cycloolefin polymer (COP). In some embodiments, the buffer layer 400 may be omitted.

When the display device 10 is folded in the out-folding manner as shown in FIG. 4, the display panel 100, the protective film 200, the polarizing film 300, the buffer layer 400, the cover window 500, the window protective film 510, and the bottom panel cover 600 of the display device 10 are bent in the folding area FDA. As a result, stress may be applied to the display panel 100, the protective film 200, the polarizing film 300, the buffer layer 400, the cover window 500, the window protective film 510, and the bottom panel cover 600 of the display device 10. Accordingly, a slip phenomenon may occur in which one end of the display panel 100, one end of the protective film 200, one end of the polarizing film 300, one end of the buffer layer 400, one end of the cover window 500, one end of the window protective film 510, and one end of the bottom panel cover 600 are not aligned in the second direction DR2.

Here, because the applied stress increases as a component is disposed adjacent to the upper portion of the display device 10, an amount of slip may increase. For example, when the display device 10 is folded in an out-folding manner, the amount of slip may be greater for layers closer to the upper surface of the display device 10 than for layers closer to a lower surface of the display device 10. As shown in FIG. 4, the one end of the protective film 200 may be shorter than (e.g., shifted away, or spaced apart, from) the one end of the bottom panel cover 600 by a first slip length SL1. The one end of the display panel 100 may be shorter than (e.g., shifted away, or spaced apart, from) the one end of the bottom panel cover 600 by a second slip length SL2 longer (e.g., greater) than the first slip length SL1. The one end of the polarizing film 300 may be shorter than (e.g., shifted away, or spaced apart, from) the one end of the bottom panel cover 600 by a third slip length SL3 longer (e.g., greater) than the second slip length SL2. One end of the buffer layer 400 may be shorter than (e.g., shifted away, or spaced apart, from) the one end of the bottom panel cover 600 by a fourth slip length SL4 longer (e.g., greater) than the third slip length SL3. The one end of the cover window 500 may be shorter than (e.g., shifted away, or spaced apart, from) the one end of the bottom panel cover 600 by a fifth slip length SL5 longer (e.g., greater) than the fourth slip length SL4.

Figure 5:
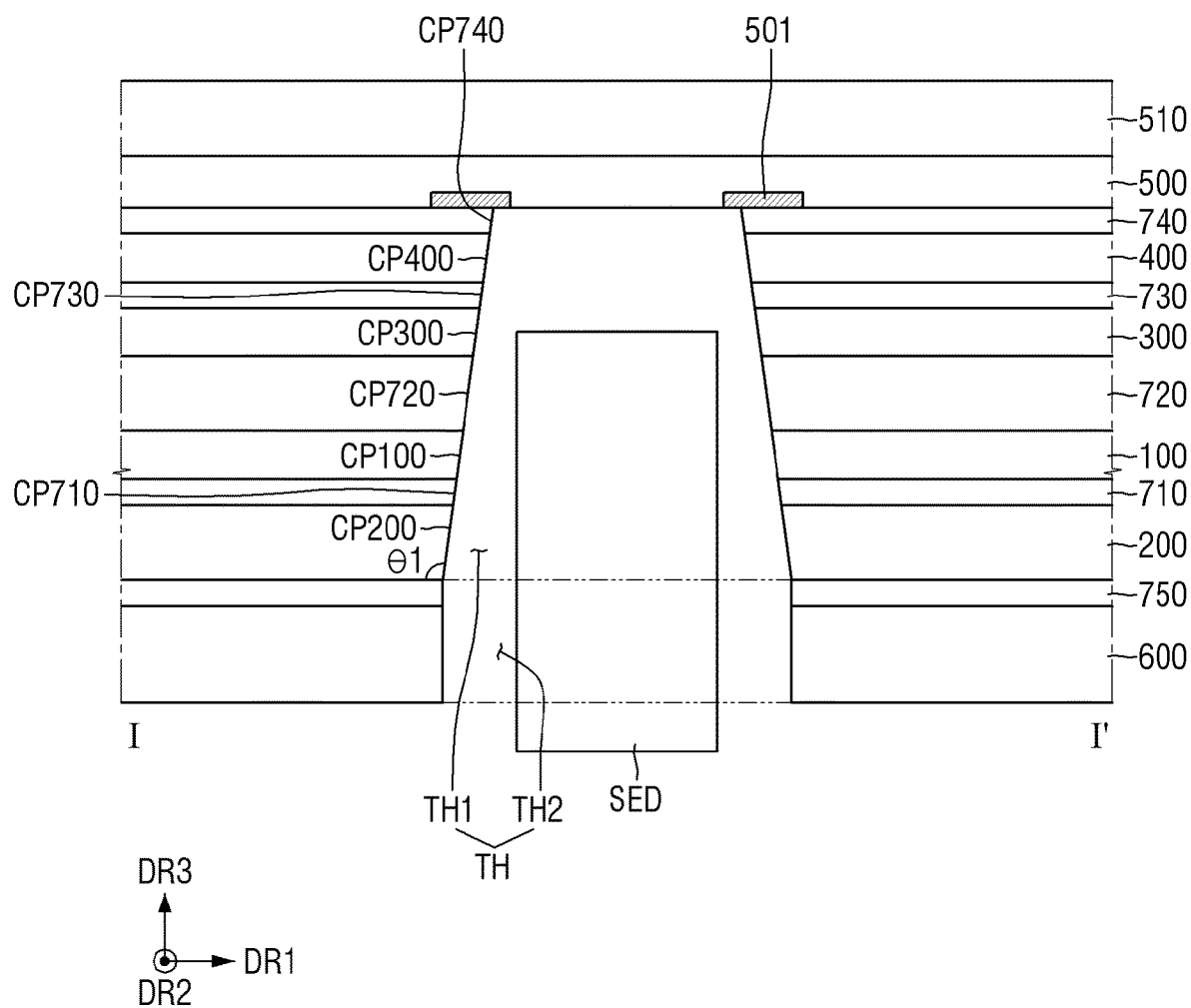
FIG. 5 is a cross-sectional view illustrating an example of a through-hole area of a foldable display device in an unfolded state according to an embodiment.
Figure 6:
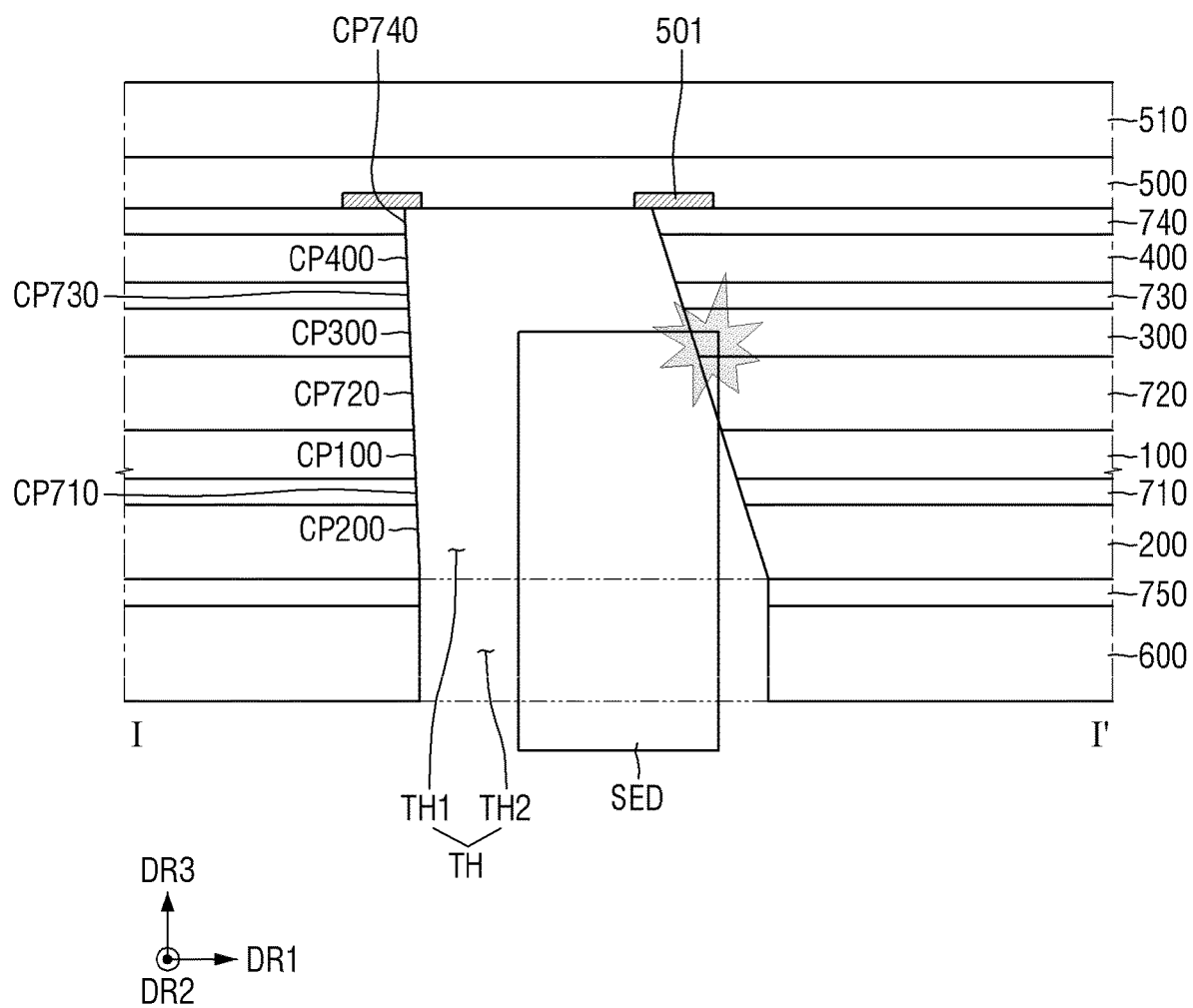
FIG. 6 is a cross-sectional view illustrating an example of a through-hole area of a foldable display device in a folded state according to an embodiment.

FIG. 5 is a cross-sectional view illustrating an example of a through-hole area of a foldable display device in an unfolded state according to an embodiment. FIG. 6 is a cross-sectional view illustrating an example of a through-hole area of a foldable display device in a folded state according to an embodiment.

Referring to FIGS. 5 and 6, a first adhesive member 710 may be disposed between the display panel 100 and the protective film 200 to be adhered to the display panel 100 and the protective film 200. A second adhesive member 720 may be disposed between the display panel 100 and the polarizing film 300 to be adhered to the display panel 100 and the polarizing film 300. A third adhesive member 730 may be disposed between the polarizing film 300 and the buffer layer 400 to be adhered to the polarizing film 300 and the buffer layer 400. A fourth adhesive member 740 may be disposed between the buffer layer 400 and the cover window 500 to be adhered to the buffer layer 400 and the cover window 500. A fifth adhesive member 750 may be disposed between the protective film 200 and the bottom panel cover 600 to be adhered to the protective film 200 and the bottom panel cover 600.

A thickness of the second adhesive member 720 may be thicker (e.g., greater) than a thickness of the display panel 100 to protect the display panel 100 from external impact. In addition, the thickness of the second adhesive member 720 may be thicker (e.g., greater) than a thickness of the first adhesive member 710, a thickness of the third adhesive member 730, a thickness of the fourth adhesive member 740, and a thickness of the fifth adhesive member 750. The first adhesive member 710, the second adhesive member 720, the third adhesive member 730, the fourth adhesive member 740, and the fifth adhesive member 750 may each be a pressure sensitive adhesive (PSA).

A light blocking pattern 501 may be disposed on one surface (e.g., a lower surface) of the cover window 500 facing the buffer layer 400. For example, in some embodiments, the light blocking pattern 501 is on an upper surface of the fourth adhesive member 740, and the cover window 500 may cover the fourth adhesive member 740. The light blocking pattern 501 may be disposed to overlap an edge of a first through-hole TH1. The light blocking pattern 501 may cover the hole area between the first through-hole TH1 and the display area DA.

The through-hole TH may include the first through-hole TH1 penetrating the display module 11 and a second through-hole TH2 penetrating the bottom panel cover 600. The first through-hole TH1 may be a hole penetrating the display panel 100, the protective film 200, the polarizing film 300, the buffer layer 400, the first adhesive member 710, the second adhesive member 720, the third adhesive member 730, and the fourth adhesive member 740 of the display module 11. The second through-hole TH2 may be a hole penetrating the fifth adhesive member 750 and the bottom panel cover 600. The first through-hole TH1 and the second through-hole TH2 may overlap in the third direction DR3.

The first through-hole TH1 may become narrower from one surface of the display module 11 facing the bottom panel cover 600 toward the other surface of the display module 11 facing the cover window 500. The first through-hole TH1 may be formed most widely on one surface of the display module 11 and may be formed most narrowly on the other surface of the display module 11. For example, when viewed from a plane, the diameter, breadth, or area of the first through-hole TH1 may be greatest at the one surface of the display module 11 and may be smallest at the other surface of the display module 11.

The first through-hole TH1 may be formed by cutting the protective film 200, the first adhesive member 710, the display panel 100, the second adhesive member 720, the polarizing film 300, the third adhesive member 730, the buffer layer 400, and the fourth adhesive member 740 by a laser. A side wall of the first through-hole TH1 may be made of (e.g., may be formed from)) a section CP200 of the protective film 200, a section CP710 of the first adhesive member 710, a section CP100 of the display panel 100, a section CP720 of the second adhesive member 720, a section CP300 of the polarizing film 300, a section CP730 of the third adhesive member 730, a section CP400 of the buffer layer 400, and a section CP740 of the fourth adhesive member 740. The section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740 may be continued (e.g., aligned) without breaking. For example, in some embodiments, the sections forming side wall of the first through-hole TH1 may be aligned so that the sidewall does not have steps. As used herein, a "section" of a component or layer may refer to a side surface of the component or layer that forms at least a portion of the sidewall of the through hole TH. For example, the section CP200 of the protective film 200 may refer to the side surface of the protective film 200 that forms a portion of the sidewall of the first through-hole TH1.

When the display device 10 is unfolded as shown in FIG. 5, the side wall of the first through-hole TH1 may be inclined at a first angle θ1 with respect to one surface of the protective film 200, for example, a lower surface of the protective film 200. The first angle θ1 may be an obtuse angle. As used herein, an obtuse angle may mean an angle within a range of greater than 90° to less than 180°. For example, when the display device 10 is unfolded, as shown in FIG. 5, the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740, which are exposed to the first through-hole TH1, may be inclined at the first angle θ1 with respect to the one surface of the protective film 200, for example, the lower surface of the protective film 200.

A sensor device SED may be disposed in the through-hole TH. The sensor device SED may be disposed apart (e.g., spaced apart) from the display panel 100, the protective film 200, the polarizing film 300, the buffer layer 400, the first adhesive member 710, and the second adhesive member 720, the third adhesive member 730, and the fourth adhesive member 740 of the display module 11, respectively. The sensor device SED may be disposed apart (e.g., spaced apart) from the fifth adhesive member 750 and the bottom panel cover 600, respectively. The sensor device SED may be disposed at a center of the through-hole TH in the first direction DR1 and the second direction DR2.

Because the sensor device SED is disposed adjacent to the cover window 500, an amount of light incident on the sensor device SED through the through-hole TH may increase. The sensor device SED may be disposed to overlap the display panel 100, the protective film 200, and the polarizing film 300 of the display module 11 in a first direction DR1. The sensor device SED may be disposed to overlap the bottom panel cover 600 in the first direction DR1. For example, in some embodiments, the sensor device SED extends in a third direction DR3 from below an upper surface of the bottom panel cover 600 to above a lower surface of the polarizing film 300.

When the first through-hole TH1 becomes narrower (e.g., has breadth that decreases) from one surface of the display module 11 facing the bottom panel cover 600 toward the other surface of the display module 11 facing the cover window 500, the protective film 200, the display panel 100, the polarizing film 300, and the buffer layer 400 of the display module 11 may slip when the display device 10 is in the folded state, as shown in FIG. 6. When the display device 10 is folded in the out-folding manner, an amount of slip increases as a configuration is disposed adjacent to the upper portion of the display device 10 (e.g., the amount of slip is greater for layers closer to an upper portion of the display device 10 than for layers closer to a bottom portion of the display device 10), and thus interference may occur between the polarizing film 300 and the sensor device SED when the display device 10 is in the folded state, as shown in FIG. 6. As a result, the sensor device SED may be damaged when the display device 10 is in the folded state. When a size of the first through-hole TH1 widens (e.g., when the breadth of the first through-hole TH1 increases from the one surface of the display module 11 facing the bottom panel cover 600 toward the other surface of the display module 11 facing the cover window 500), interference between the polarizing film 300 and the sensor device SED may be prevented or reduced when the display device 10 is in the folded state. However, in this case, a size of the display area DA of the display panel 100 may be reduced.

Figure 7:
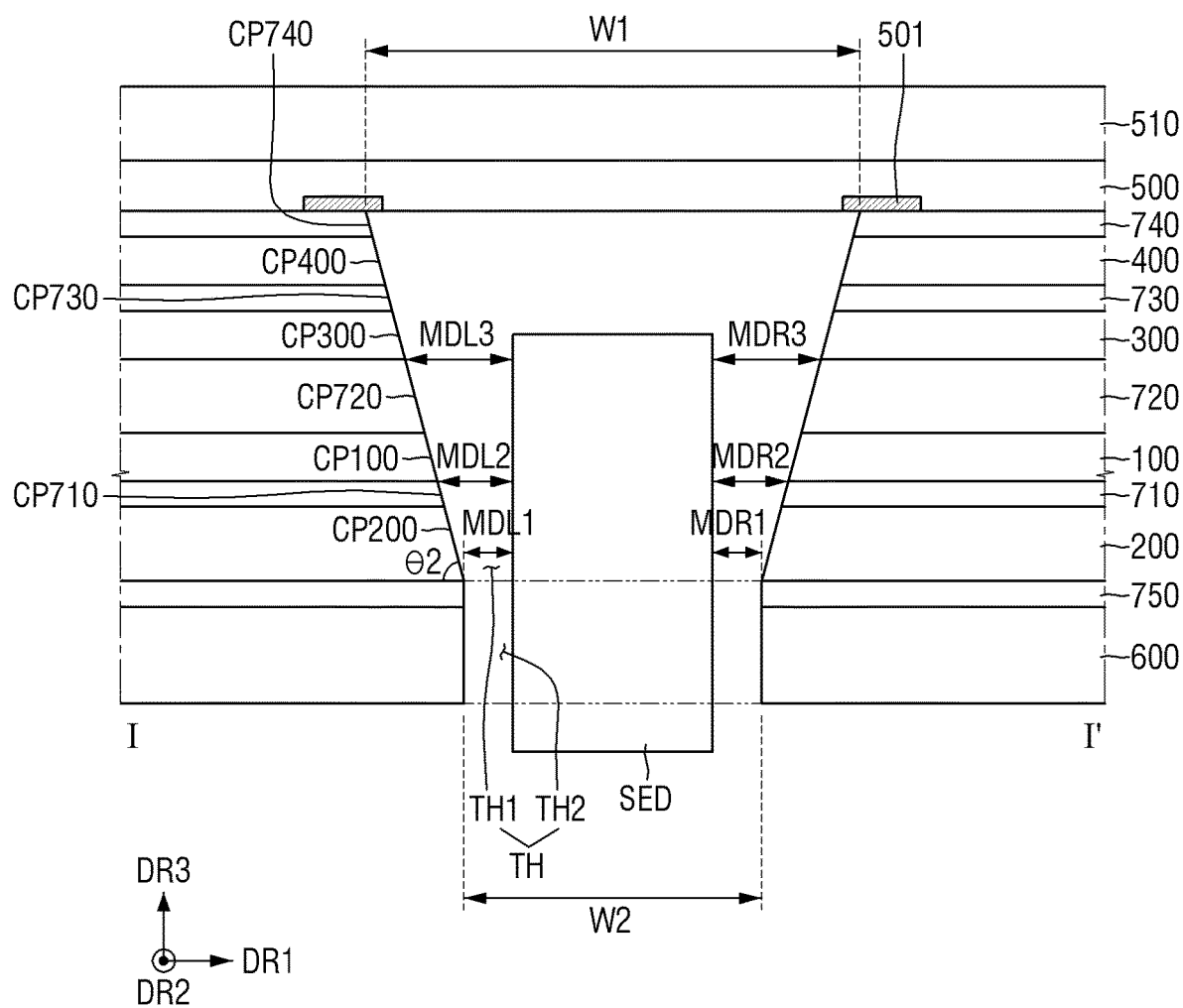
FIG. 7 is a cross-sectional view illustrating an example of a through-hole area of a foldable display device in an unfolded state according to an embodiment.
Figure 8:
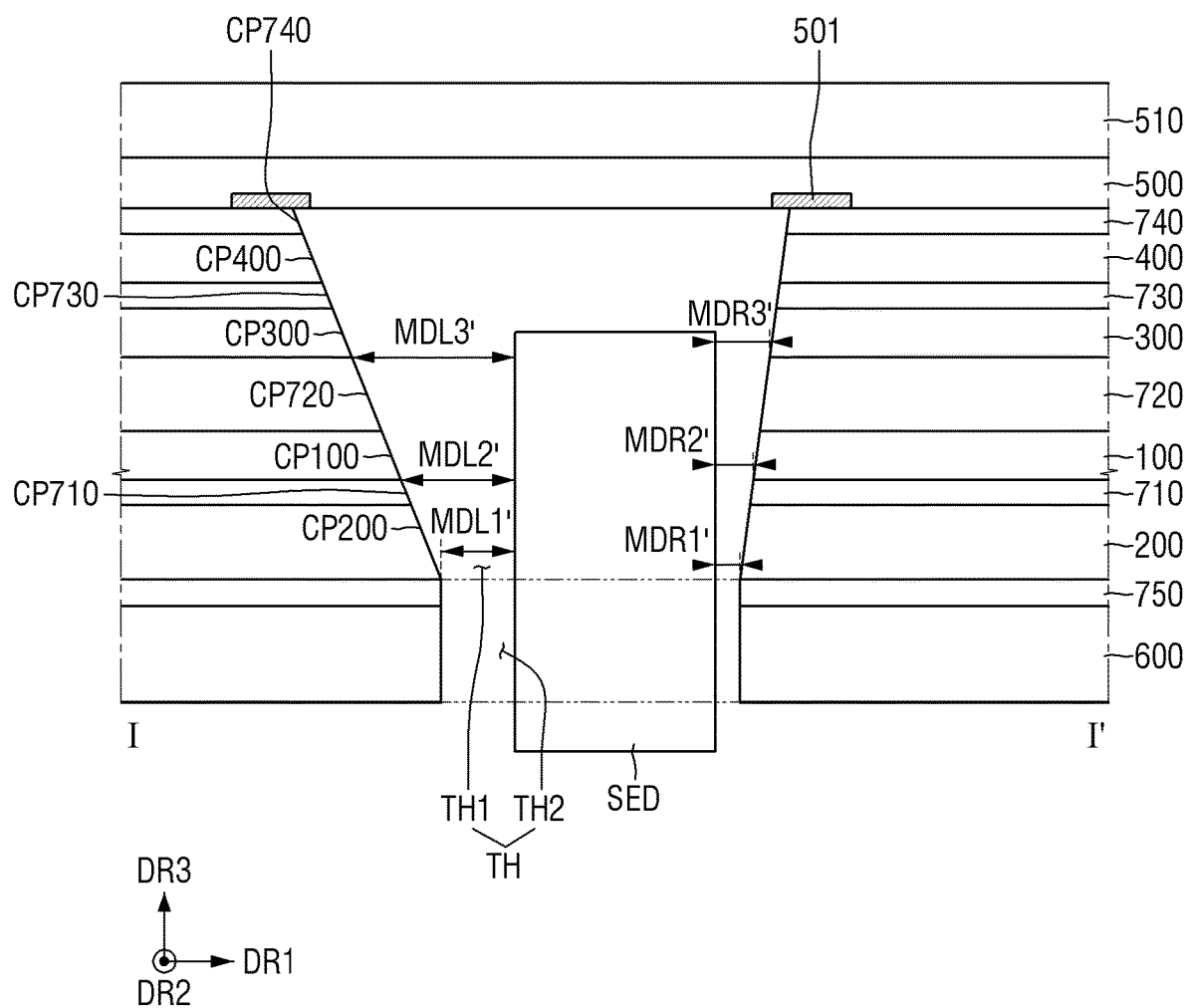
FIG. 8 is a cross-sectional view illustrating an example of a through-hole area of a foldable display device in a folded state according to an embodiment.

FIG. 7 is a cross-sectional view illustrating an example of a through-hole area of a foldable display device in an unfolded state according to an embodiment. FIG. 8 is a cross-sectional view illustrating an example of a through-hole area of a foldable display device in a folded state according to an embodiment.

Embodiments in FIGS. 7 and 8 differ from embodiments in FIGS. 5 and 6 in that the first through-hole TH1 widens from one surface of the display module 11 facing the bottom panel cover 600 toward the other surface of the display module 11 facing the cover window 500.

Referring to FIGS. 7 and 8, the first through-hole TH1 may be formed most narrowly on the one surface of the display module 11, and may be formed most widely on the other surface of the display module 11. As a result, a maximum size W2 (e.g., width, breadth, diameter, area, etc.) of the second through-hole TH2 may be smaller than a maximum size W1 (e.g., width, breadth, diameter, area, etc.) of the first through-hole TH1.

For example, when the display device 10 is unfolded, as shown in FIG. 7, the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740, which form the side wall of the first through-hole TH1, may be inclined at a second angle θ2 with respect to the one surface of the protective film 200, for example, the lower surface of the protective film 200. The second angle θ2 may be an acute angle. As used herein, an acute angle may mean an angle within the range of greater than 0° to less than 90°.

In the unfolded state of the display device 10, as shown in FIG. 7, a minimum distance MDR1/MDL1 between the protective film 200 and the sensor device SED may be shorter (e.g., less) than a minimum distance MDR2/MDL2 between the display panel 100 and the sensor device SED. In addition, in the unfolded state of the display device 10, a minimum distance MDR3/MDL3 between the polarizing film 300 and the sensor device SED may be longer (e.g., greater) than a minimum distance MDR2/MDL2 between the display panel 100 and the sensor device SED.

In the unfolded state of the display device 10, as shown in FIG. 7, a minimum distance MDR1 between the protective film 200 and a right side of the sensor device SED and a minimum distance MDL1 between the protective film 200 and a left side of the sensor device SED may be the same or substantially the same. In addition, in the unfolded state of the display device 10, a minimum distance MDR2 between the display panel 100 and the right side of the sensor device SED and a minimum distance MDL2 between the display panel 100 and the left side of the sensor device SED may be the same or substantially the same. In addition, in the unfolded state of the display device 10, a minimum distance MDR3 between the polarizing film 300 and the right side of the sensor device SED and a minimum distance MDL3 between the polarizing film 300 and the left side of the sensor device SED may be the same or substantially the same.

In the unfolded state of the display device 10 as shown in FIG. 7, the minimum distance MDR1/MDL1 between the protective film 200 and the sensor device SED differs from a minimum distance MDR1'/MDL1' between the protective film 200 and the sensor device SED in the folded state of the display device 10, as shown in FIG. 8. For example, in the unfolded state of the display device 10 as shown in FIG. 7, a minimum distance MDR1 between the right side of the sensor device SED and the protective film 200 may be longer (e.g., greater) than a minimum distance MDR1' between the right side of the sensor device SED and the protective film 200 in the folded state of the display device 10, as shown in FIG. 8. In addition, in the unfolded state of the display device 10 as shown in FIG. 7, the minimum distance MDL1 between the left side of the sensor device SED and the protective film 200 may be shorter (e.g., less) than the minimum distance MDL1' between the left side of the sensor device SED and the protective film 200 in the folded state of the display device 10, as shown in FIG. 8.

In addition, in the unfolded state of the display device 10 as shown in FIG. 7, the minimum distance MDR2/MDL2 between the display panel 100 and the sensor device SED may differ from a minimum distance MDR2'/MDL2' between the display panel 100 and the sensor device SED in the folded state of the display device 10, as shown in FIG. 8. Further, in the unfolded state of the display device 10 as shown in FIG. 7, a minimum distance MDR3/MDL3 between the polarizing film 300 and the sensor device SED may differ from a minimum distance MDR3'/MDL3' between the polarizing film 300 and the sensor device SED in the folded state of the display device 10, as shown in FIG. 8.

When the first through-hole TH1 widens from one surface of the display module 11 facing the bottom panel cover 600 toward the other surface of the display module 11 facing the cover window 500, it is possible to prevent or reduce interference between components of the display device 10 and the sensor device SED even if the protective film 200, the display panel 100, the polarizing film 300, and the buffer layer 400 of the display module 11 slip when the display device 10 is folded in the out-folding manner, as shown in FIG. 8.

Figure 9:
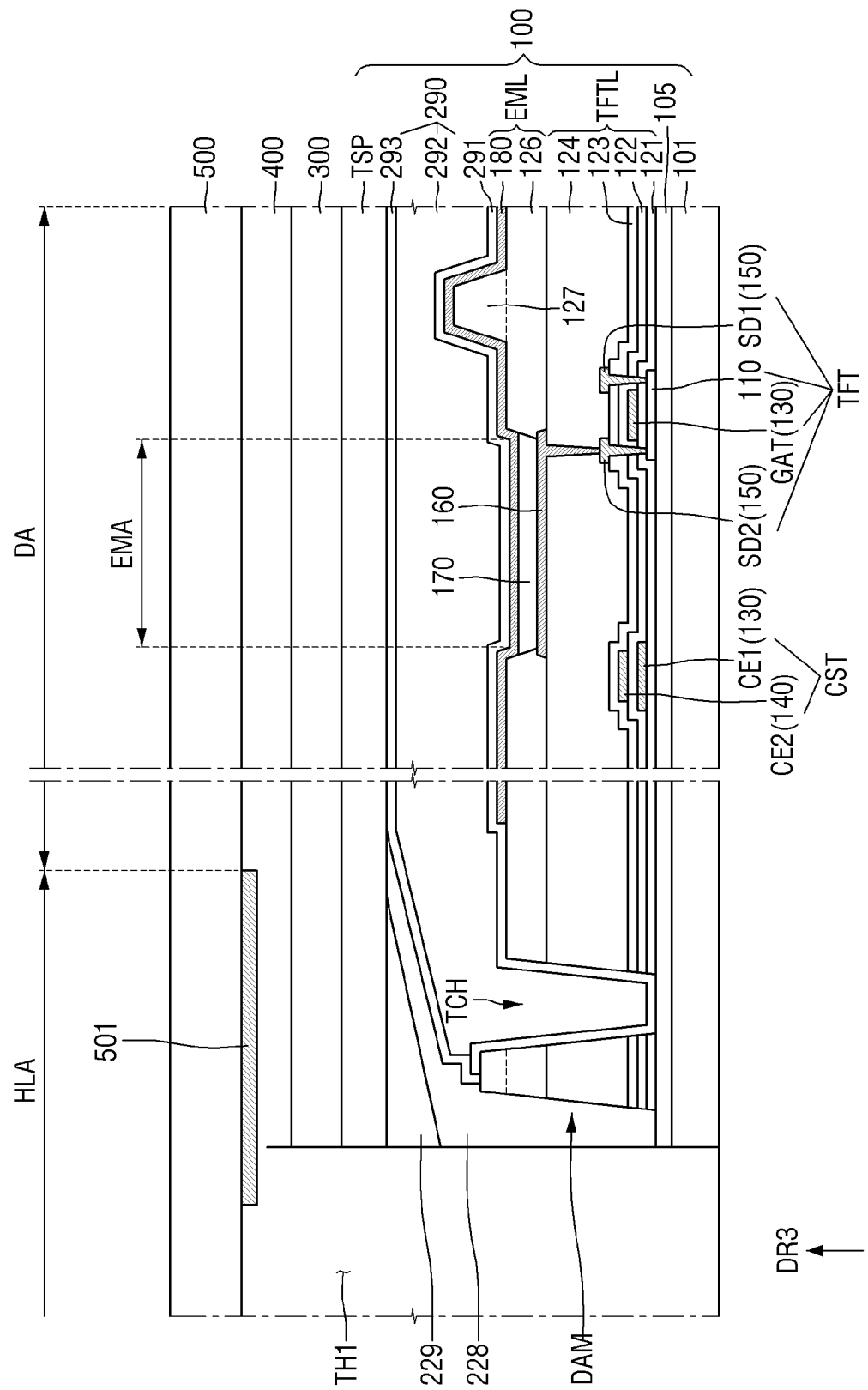
FIG. 9 is a cross-sectional view illustrating a display device according to an embodiment.

FIG. 9 is a cross-sectional view illustrating a display device according to an embodiment. FIG. 9 illustrates a cross-sectional view of the display area DA and the through-hole TH of the display device 10 according to an embodiment. In FIG. 9, the protective film 200, the bottom panel cover 600, and the first to fifth adhesive members 710, 720, 730, 740, and 750 are omitted for convenience of description.

Referring to FIG. 9, the display panel 100 may include a substrate 101, a buffer film 105 disposed on the substrate 101, a thin film transistor layer TFTL disposed on the buffer film 105, a light emitting element layer EML disposed on the film transistor layer TFTL, and an encapsulation layer 290 disposed on the light emitting element layer EML.

The substrate 101 may include (e.g., be made of) a polymer resin such as polyimide for folding, but it is not limited thereto.

The buffer film 105 is disposed on the substrate 101. The buffer film 105 may be formed on one surface of the substrate 101 to protect the thin film transistor layer TFTL and the light emitting element layer EML from moisture penetrating through the substrate 101, which is vulnerable to moisture permeation. For example, the buffer film 105 may prevent or reduce the occurrence of moisture penetrating into, and permeating through, the thin film transistor layer TFTL and the light emitting layer EML. The buffer film 105 may be made of a plurality of inorganic films that are alternately stacked. For example, the buffer film 105 may be formed of a multilayer film in which one or more inorganic films selected from a silicon nitride layer, a silicon oxynitride layer, a silicon oxide layer, a titanium oxide layer, and an aluminum oxide layer are alternately stacked. In some embodiments, the buffer film 105 may be omitted.

The thin film transistor layer TFTL including a thin film transistor TFT and a capacitor CST may be disposed on the buffer film 105. The thin film transistor layer TFTL may include, a semiconductor layer 110, a first insulating layer 121, a second insulating layer 122, a third insulating layer 123, a first gate conductive layer 130, a second gate conductive layer 140. In some embodiments, the thin film transistor layer TFTL may also include a data conductive layer 150.

FIG. 9 exemplifies that the thin film transistor TFT is formed in a top gate manner (e.g., structure) in which a gate electrode GAT is positioned on (e.g., above) an upper portion of the semiconductor layer 110, but it is not limited thereto. For example, the thin film transistor TFT may be formed in a lower gate (bottom gate) manner (e.g., structure) in which the gate electrode GAT is positioned on (e.g., below) a lower portion of the semiconductor layer 110, or in a double gate manner (e.g., structure) in which the gate electrode GAT is positioned on the upper and lower portion of the semiconductor layer 110 (e.g., above and below the semiconductor layer 110).

The semiconductor layer 110 of the thin film transistor TFT may be disposed on the buffer film 105. The semiconductor layer 110 may include (e.g., be) polycrystalline silicon, monocrystalline silicon, low temperature polycrystalline silicon, amorphous silicon, and/or an oxide semiconductor. A light blocking layer may be formed between the buffer film 105 and the semiconductor layer 110 to block external light incident to the semiconductor layer 110 (e.g., to block, prevent, or reduce the occurrence of external light from being incident onto the semiconductor layer 110).

The first insulating layer 121 may be formed on the semiconductor layer 110. The first insulating layer 121 may be formed of an inorganic layer, for example, a silicon nitride layer, a silicon oxynitride layer, a silicon oxide layer, a titanium oxide layer, or an aluminum oxide layer.

The first gate conductive layer 130 including the gate electrode GAT and a first electrode CE1 of the capacitor CST may be disposed on the first insulating layer 121. The gate electrode GAT may overlap the semiconductor layer 110 in the third direction DR3. The first gate conductive layer 130 may be formed of a single layer or multiple layers including (e.g., being) a material selected from the group consisting of molybdenum (Mo), aluminum (Al), chromium (Cr), gold (Au), titanium (Ti), nickel (Ni), neodymium (Nd), and copper (Cu), and alloys thereof.

The second insulating layer 122 may be disposed on the first gate conductive layer 130. The second insulating layer 122 may be formed of an inorganic layer, for example, a silicon nitride layer, a silicon oxy nitride layer, a silicon oxide layer, a titanium oxide layer, and/or an aluminum oxide layer.

The second gate conductive layer 140 including a second electrode CE2 of the capacitor CST may be disposed on the second insulating layer 122. The second electrode CE2 of the capacitor CST may overlap the first electrode CE1 of the capacitor CST in the third direction DR3. The second gate conductive layer 140 may be formed of a single layer or multiple layers including (e.g., being) a material selected from the group consisting of molybdenum (Mo), aluminum (Al), chromium (Cr), gold (Au), titanium (Ti), nickel (Ni), neodymium (Nd), and copper (Cu), and alloys thereof.

The third insulating layer 123 may be disposed on the second gate conductive layer 140. The third insulating layer 123 may be formed of an inorganic layer, for example, a silicon nitride layer, a silicon oxynitride layer, a silicon oxide layer, a titanium oxide layer, and/or an aluminum oxide layer.

A data conductive layer 150 including a first electrode SD1 and a second electrode SD2 of the thin film transistor TFT may be disposed on the third insulating layer 123. In the data conductive layer 150, the first electrode SD1 and the second electrode SD2 of the thin film transistor TFT may each be connected to the semiconductor layer 110 through a contact hole penetrating through the third insulating layer 123, the second insulating layer 122, and the first insulating layer 121.

A fourth insulating layer 124 may be disposed on the data conductive layer 150. The fourth insulating layer 124 may be a planarization film for planarizing a step caused by the thin film transistor TFT. The fourth insulating layer 124 may be formed of an organic film such as an acrylic resin, an epoxy resin, a phenolic resin, a polyamide resin, a polyimide resin, and/or the like.

The light emitting element layer EML is formed on the thin film transistor layer TFTL. The light emitting element layer EML may include an anode electrode 160, a light emitting layer 170, and a cathode electrode 180.

The anode electrode 160 is disposed on the fourth insulating layer 124. The anode electrode 160 may be connected to the second electrode SD2 of the thin film transistor TFT through a contact hole penetrating through the fourth insulating layer 124. The anode electrode 160 may at least partially overlap a light emitting area EMA.

When the light emitting element layer EML has a top emission structure that emits light toward the cathode electrode 180 with respect to the light emitting layer 170, the anode electrode 160 may be formed of a single layer of molybdenum (Mo), titanium (Ti), copper (Cu), and/or aluminum (Al), or may be formed of a highly reflective metal material such as a stacked structure of Aluminum and Titanium (Ti/Al/Ti), a stacked structure of Aluminum and ITO (ITO/Al/ITO), APC alloys, and/or a stacked structure of APC alloys and ITO (ITO/APC/ITO). The APC alloys are alloys of silver (Ag), palladium (Pd), and copper (Cu).

When the light emitting element layer EML has a bottom emission structure that emits light toward the anode electrode 160 with respect to the light emitting layer 170, the anode electrode 160 may be formed of a transparent conductive material (TCO) such as ITO and/or IZO, which may transmit light, or a semi-transmissive conductive material such as magnesium (Mg), silver (Ag), or an alloy of magnesium (Mg) and silver (Ag). Here, when the anode electrode 160 is formed of the semi-transmissive metal material, the light emission efficiency may be increased by a micro cavity.

A bank 126 may be disposed on the anode electrode 160. A bank 126 is disposed on the anode electrode 160, and may include an opening that exposes the anode electrode 160. Therefore, the light emitting area EMA and a non-light emitting area NEM may be divided by the bank 126. For example, the bank 126 may be on the fourth insulating layer 124 and on a part of the anode electrode 160, and the bank 126 may have an opening that exposes another part (e.g., a center part) of the anode electrode 160.

A spacer 127 may be disposed on the bank 126. The spacer 127 may serve to maintain a distance from a structure disposed on an upper portion of the spacer 127 during a manufacturing process.

The light emitting layer 170 is disposed on the anode electrode 160 exposed by the bank 126 (e.g., on the portion of the anode electrode 160 exposed by the opening in the bank 126). The light emitting layer 170 may include an organic material layer. The organic material layer of the light emitting layer 170 may include an organic light emitting layer, and may further include a hole injection layer, a hole transport layer, an electron injection layer, and/or an electron transport layer.

The cathode electrode 180 may be disposed on the light emitting layer 170. The cathode electrode 180 may be commonly formed in pixels.

When the light emitting element layer EML has the top emission structure, the cathode electrode 180 may be formed of a transparent conductive material (TCO) such as ITO and/or IZO, which may transmit light, or a semi-transmissive conductive material such as magnesium (Mg), silver (Ag), or an alloy of magnesium (Mg) and silver (Ag). Here, when the cathode electrode 180 is formed of the semi-transmissive metal material, the light emission efficiency may be increased by a micro cavity.

When the light emitting element layer EML has the bottom emission structure, the cathode electrode 180 may be formed of a single layer of molybdenum (Mo), titanium (Ti), copper (Cu), and/or aluminum (Al), or may be formed of a highly reflective metal material such as a stacked structure of Aluminum and Titanium (Ti/Al/Ti), a stacked structure of Aluminum and ITO (ITO/Al/ITO), APC alloys, and/or a stacked structure of APC alloys and ITO (ITO/APC/ITO).

The encapsulation layer 290 includes a first inorganic layer 291, a first organic layer 292, and a second inorganic layer 293 and is disposed on an upper portion of the cathode electrode 180. The first organic layer 292 may be sealed by the first inorganic layer 291 and the second inorganic layer 293.

The first inorganic layer 291 and the second inorganic layer 293 may each be formed of a silicon nitride layer, a silicon oxynitride layer, a silicon oxide layer, a titanium oxide layer, and/or an aluminum oxide layer, but they are not limited thereto. The first organic layer 292 may be formed of an acrylic resin, an epoxy resin, a phenolic resin, a polyamide resin, a polyimide resin, and/or the like, but it is not limited thereto.

The display panel 100 may further include a touch layer TSP disposed on the encapsulation layer 290. The touch layer TSP may include sensor electrodes for sensing a touch input. In some embodiments, the touch layer TSP may be provided as a panel or a film separate from the display panel 100 and attached to the display panel 100.

The polarizing film 300 may be disposed on the touch layer TSP of the display panel 100. The buffer layer 400 may be disposed on the polarizing film 300, and the cover window 500 may be disposed on the buffer layer 400.

A dam structure DAM may be disposed around the first through-hole TH1. The dam structure DAM may include stacked insulating layers 105, 121, 122, 123, 124, 126, and 127. A groove TCH may be disposed between the dam structure DAM and the light emitting area EMA, in which the insulating layers 121, 122, 123, 124, 126, and 127 and the metal layers 130, 140, 150, 160, and 180, except the substrate 101, are removed from the groove TCH. At least a portion of the encapsulation layer 290 may be disposed in the groove TCH. For example, in some embodiments, the first organic layer 292 of the encapsulation layer 290 is disposed up to the dam structure DAM, and is not disposed in the hole area HLA between the dam structure DAM and the first through-hole TH1. Thus, the dam structure DAM may prevent or block the first organic layer 292 from overflowing into, or may reduce the amount of overflow of the first organic layer 292 into, the hole area HLA between the dam structure and the first through-hole TH1. FIG. 9 illustrates a structure in which the first inorganic film 291 and the second inorganic film 293 terminate on the dam structure DAM, but they are not limited thereto. For example, the first inorganic layer 291 or the second inorganic layer 293 of the encapsulation layer 290 may be disposed in the hole area HLA between the dam structure DAM and the through-hole TH.

The hole area HLA may overlap the dam structure DAM in the third direction DR3, and may not overlap the emission area EMA. For example, the hole area HLA may be spaced apart from the emission area EMA, and the dam structure DAM may be in the hole area HLA. Therefore, an image may not be displayed in the hole area HLA. The light blocking pattern 501 may be disposed in the hole area HLA. The light blocking pattern 501 may overlap the dam structure DAM in the third direction DR3. The light blocking pattern 501 may overlap an edge of the first through-hole TH1 in the third direction DR3. For example, the light blocking pattern 501 may overlap a portion of the first through-hole TH1 in the third direction DR3.

In order to planarize a space between the dam structure DAM and the first through-hole TH1 in the hole area HLA, at least one organic layer may be further disposed on an upper portion of the encapsulation layer 290. For example, a second organic layer 228 may be disposed on the second inorganic layer 293, and a third organic layer 229 may be disposed on the second organic layer 228. The second organic layer 228 and the third organic layer 229 may serve to fill and planarize the space between the dam structure DAM and the first through-hole TH1 in the hole area HLA.

Figure 10:
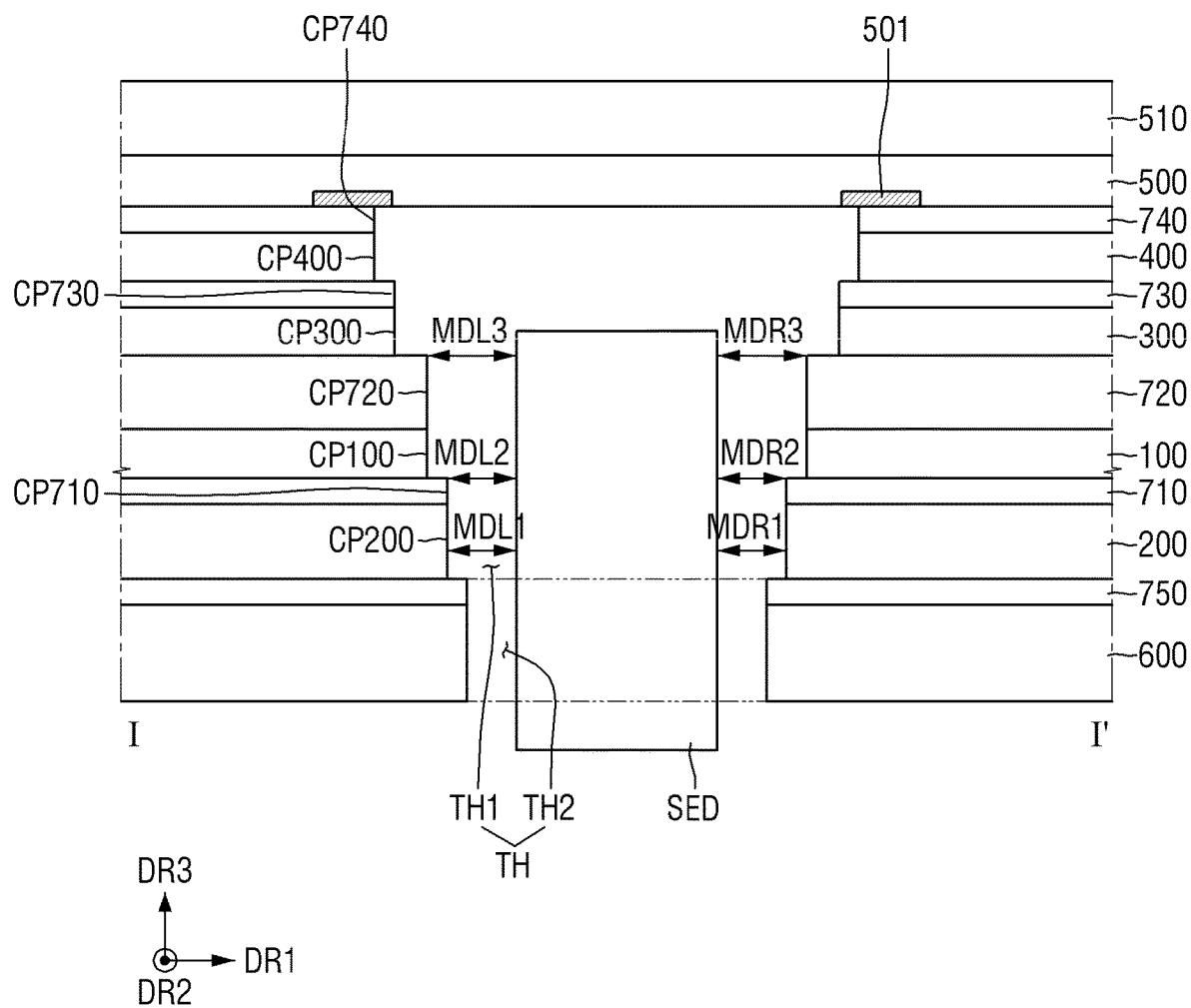
FIG. 10 is a cross-sectional view illustrating an example of a through-hole area of a foldable display device in an unfolded state according to an embodiment.
Figure 11:
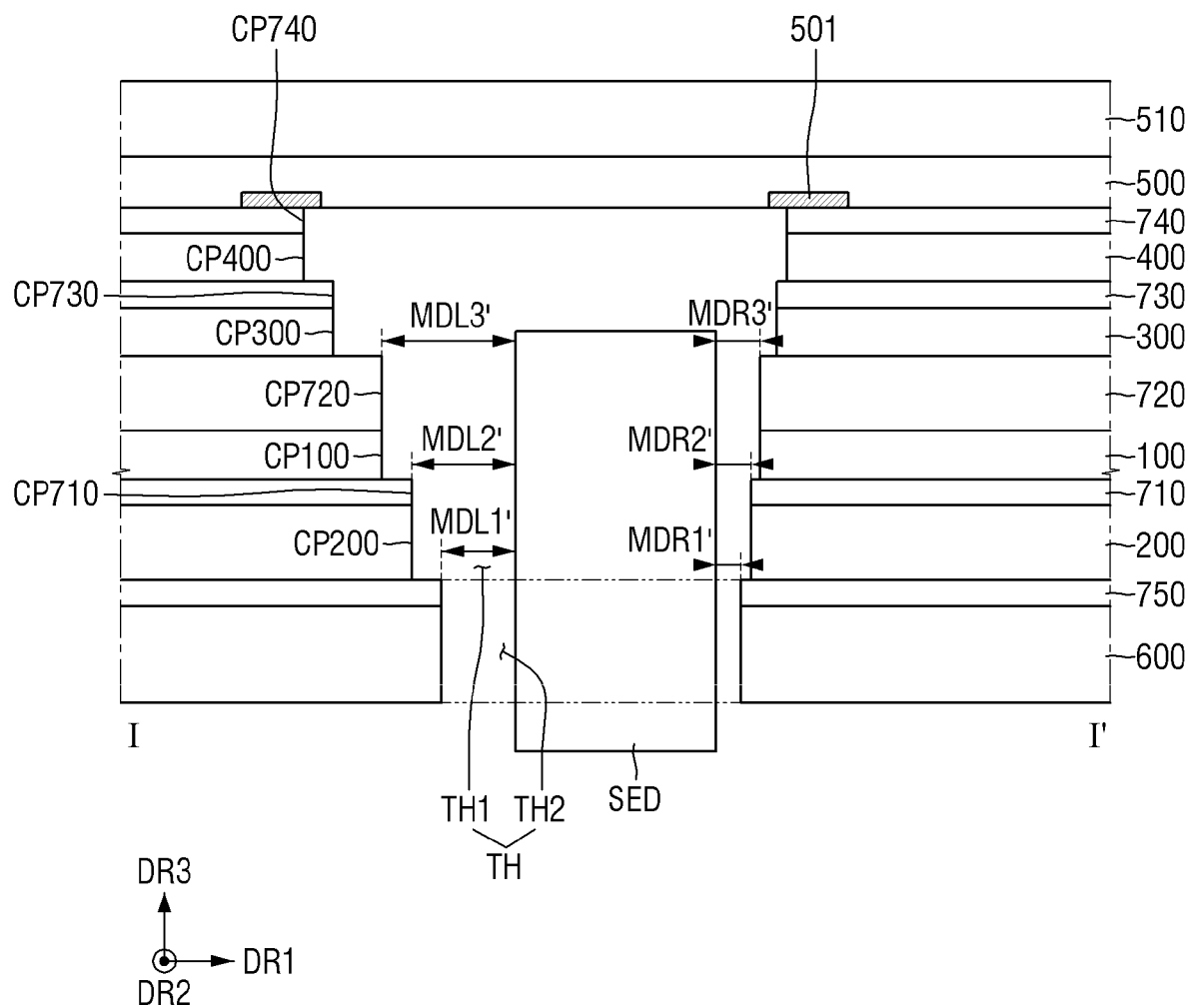
FIG. 11 is a cross-sectional view illustrating an example of a through-hole area of a foldable display device in a folded state according to an embodiment.

FIG. 10 is a cross-sectional view illustrating an example of a through-hole area of a foldable display device in an unfolded state according to an embodiment. FIG. 11 is a cross-sectional view illustrating an example of a through-hole area of a foldable display device in a folded state according to an embodiment.

Embodiments in FIGS. 10 and 11 differ from embodiments in FIGS. 7 and 8 in that a cross section of a side wall of the first through-hole TH1 is formed in a step shape.

Referring to FIGS. 10 and 11, the side wall of the first through-hole TH1 may be made of the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740. The section CP200 of the protective film 200 and the section CP710 of the first adhesive member 710 may be connected to (e.g., aligned with) each other, while the section CP710 of the first adhesive member 710 and the section CP100 of the display panel 100 may be cut off from (e.g., shifted away, or spaced apart, from) each other. In addition, the section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. In addition, the section CP300 of the polarizing film 300 and the section CP730 of the third adhesive member 730 may be connected to (e.g., aligned with) each other, while the section CP730 of the third adhesive member 730 and the section CP400 of the buffer layer 400 may be cut off from (e.g., shifted away, or spaced apart, from) each other. The section CP400 of the buffer layer 400 and the section CP740 of the fourth adhesive member 740 may be connected to (e.g., aligned with) each other. As a result, a cross section of the side wall of the first through-hole TH1 may have a step shape.

When the first through-hole TH1 widens from the one surface of the display module 11 facing the bottom panel cover 600 toward the other surface of the display module 11 facing the cover window 500, it is possible to prevent or reduce interference between the components of the display device 10 and the sensor device SED even if the protective film 200, the display panel 100, the polarizing film 300, and the buffer layer 400 of the display module 11 slip when the display device 10 is folded in the out-folding manner, as shown in FIG. 11.

Figure 12:
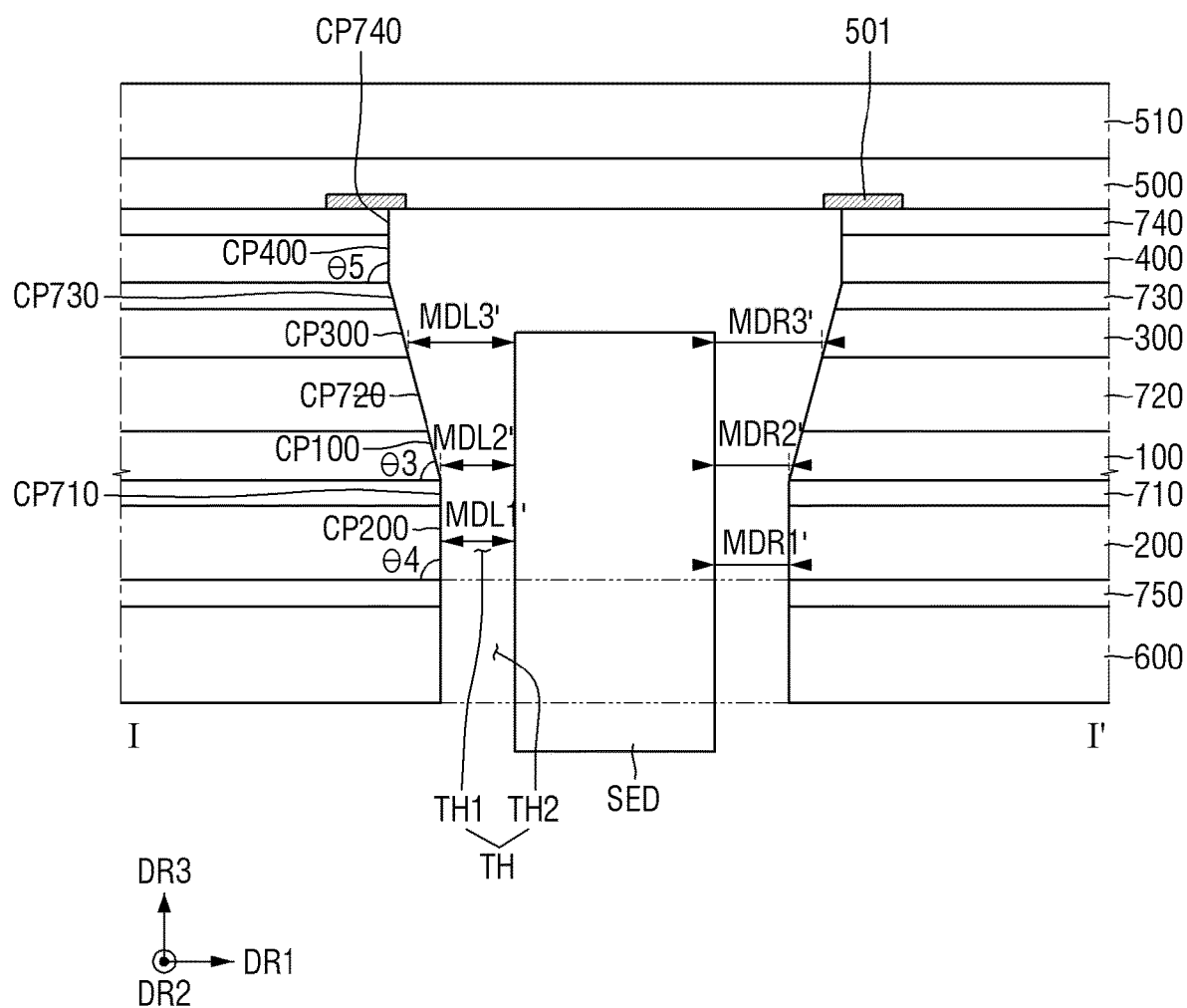
FIG. 12 is a cross-sectional view illustrating an example of a through-hole area of a foldable display device in an unfolded state according to an embodiment.
Figure 13:
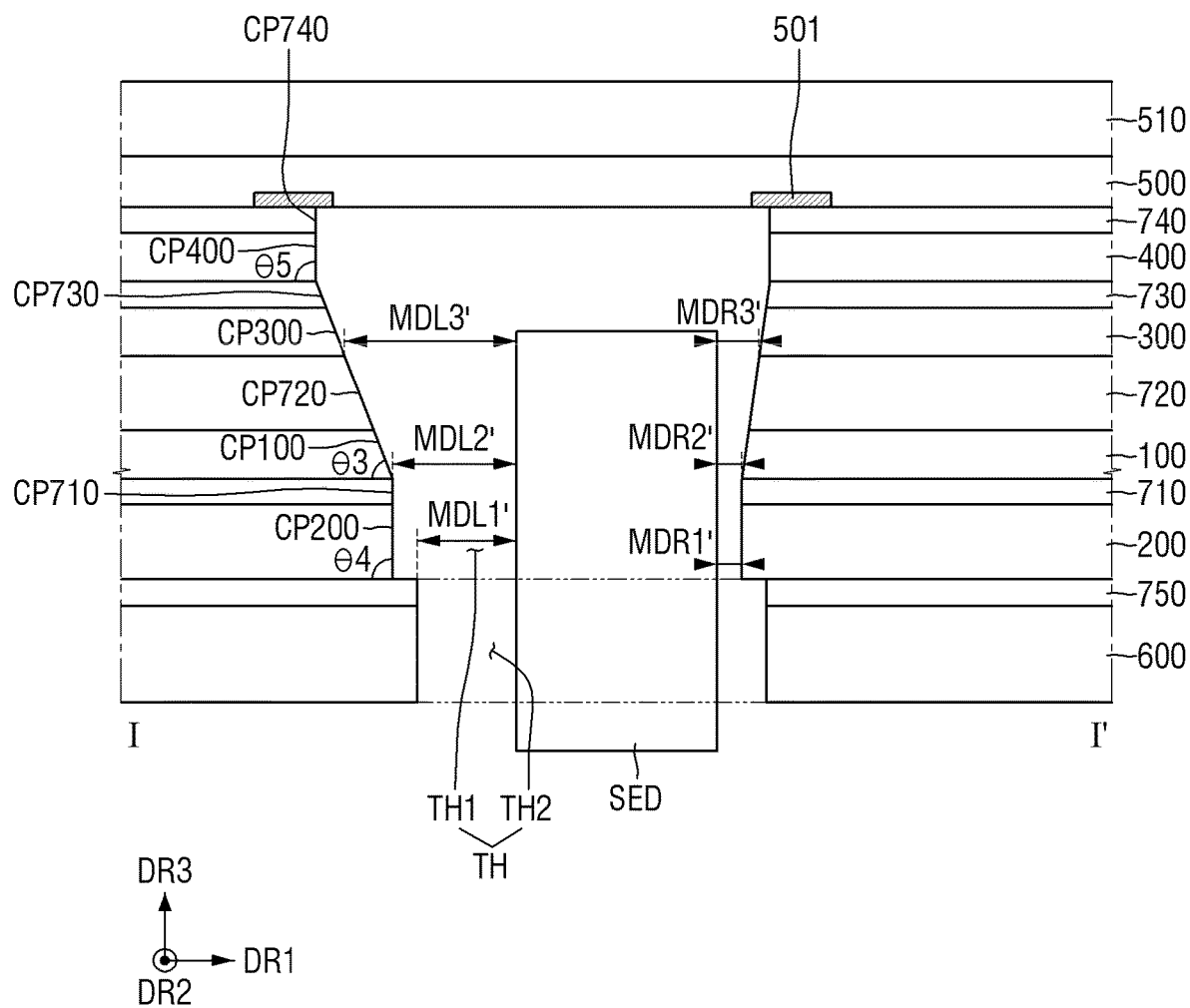
FIG. 13 is a cross-sectional view illustrating an example of a through-hole area of a foldable display device in a folded state according to an embodiment.

FIG. 12 is a cross-sectional view illustrating an example of a through-hole area of a foldable display device in an unfolded state according to an embodiment. FIG. 13 is a cross-sectional view illustrating an example of a through-hole area of a foldable display device in a folded state according to an embodiment.

Embodiments in FIGS. 12 and 13 differ from embodiments in FIGS. 7 and 8 in that a portion of the first through-hole TH1 widens.

Referring to FIGS. 12 and 13, the side wall of the first through-hole TH1 may be made of (e.g., formed from) the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740.

The section CP100 of the display panel 100, the section CP720 of the second adhesive member 720, the section CP300 of the polarizing film 300, and the section CP730 of the third adhesive member 730 may be inclined at a third angle θ3 with respect to one surface of the display panel 100, for example, the lower surface of the display panel 100. The third angle θ3 may be an acute angle.

The section CP200 of the protective film 200 and the section CP710 of the first adhesive member 710 may be inclined at a fourth angle θ4 relative to one surface of the protective film 200, for example, the lower surface of the protective film 200. The fourth angle θ4 may be an angle greater than the third angle θ3. For example, the fourth angle θ4 may be a right angle. As used herein, a right angle may mean an angle equal to, or substantially equal to, about 90°.

The section CP400 of the buffer layer 400 and the section CP740 of the fourth adhesive member 740 may be inclined at a fifth angle θ5 with respect to one surface of the buffer layer 400, for example, a lower surface of the buffer layer 400. The fifth angle θ5 may be an angle greater than the third angle θ3. For example, the fifth angle θ5 may be a right angle.

When the first through-hole TH1 widens from the one surface of the display module 11 facing the bottom panel cover 600 toward the other surface of the display module 11 facing the cover window 500, it is possible to prevent or reduce interference between the components of the display device 10 and the sensor device SED even if the protective film 200, the display panel 100, the polarizing film 300, and the buffer layer 400 of the display module 11 slip when the display device 10 is folded in the out-folding manner, as shown in FIG. 13.

Although not shown in FIGS. 12 and 13, a portion of a cross section of the side wall of the first through-hole TH1 may be formed in a step shape. For example, the section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. The section CP300 of the polarizing film 300 and the section CP730 of the third adhesive member 730 may be connected to (e.g., aligned with) each other.

Figure 14:
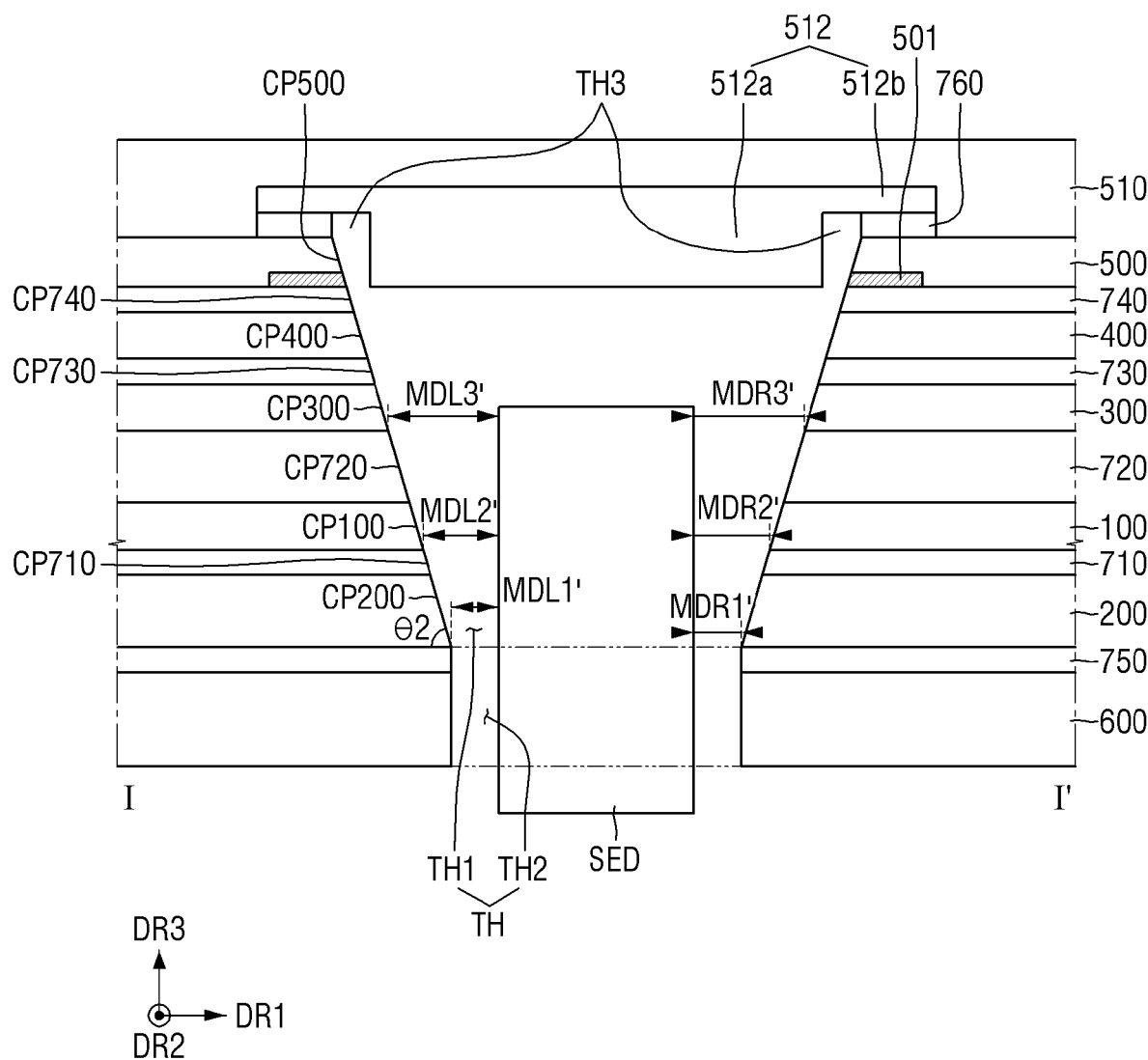
FIG. 14 is a cross-sectional view illustrating an example of a through-hole area of a foldable display device in an unfolded state according to an embodiment.
Figure 15:
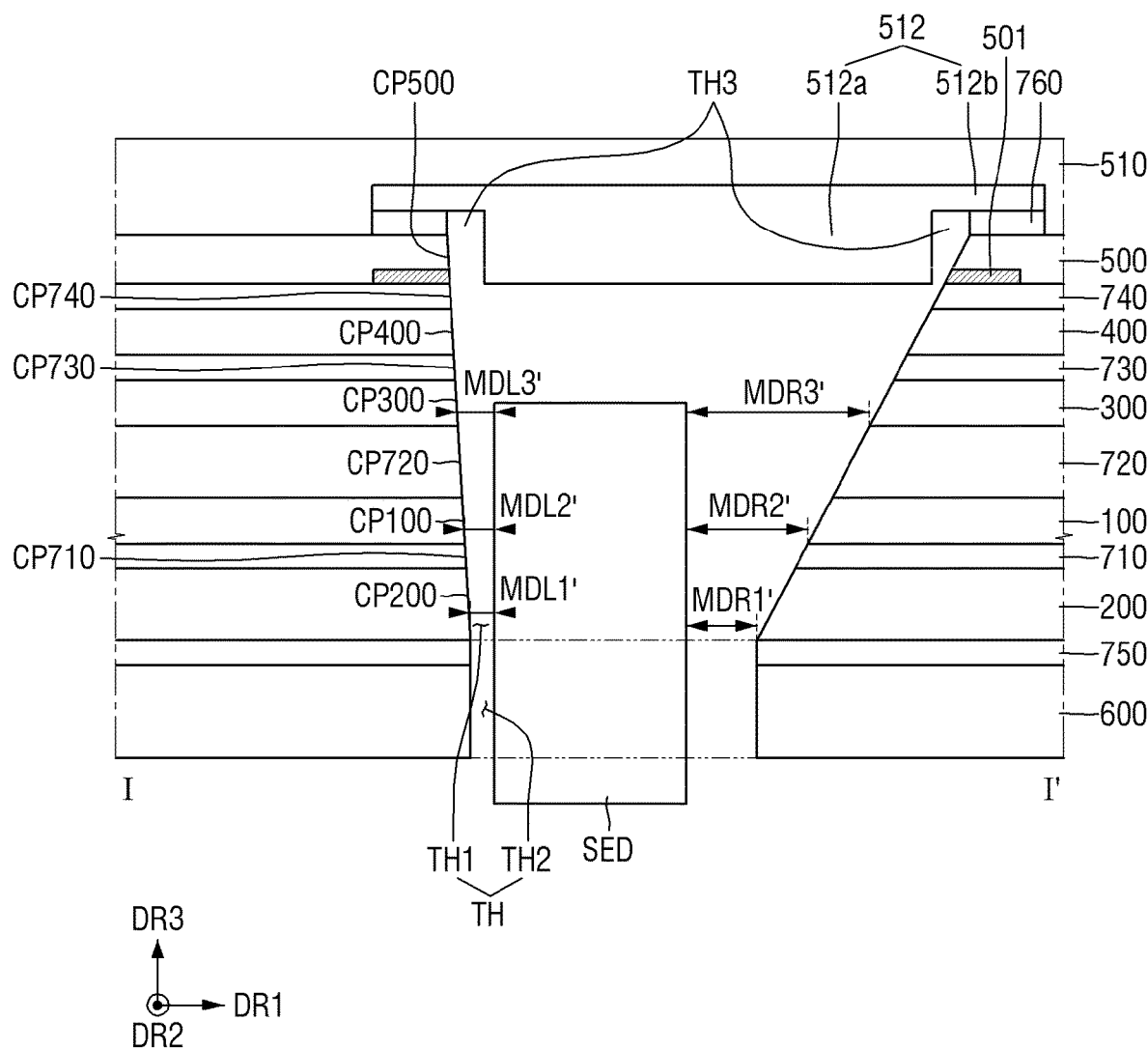
FIG. 15 is a cross-sectional view illustrating an example of a through-hole area of a foldable display device in a folded state according to an embodiment.

FIG. 14 is a cross-sectional view illustrating an example of a through-hole area of a foldable display device in an unfolded state according to an embodiment. FIG. 15 is a cross-sectional view illustrating an example of a through-hole area of a foldable display device in a folded state according to an embodiment.

Embodiments in FIGS. 14 and 15 differ from embodiments in FIGS. 7 and 8 in that the first through-hole TH1 penetrates the cover window 500, and a through-hole cover 512 is disposed on the cover window 500 to cover a third through-hole TH3.

Referring to FIGS. 14 and 15, the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, the section CP740 of the fourth adhesive member 740, and a section of the cover window 500, which form the side wall of the first through-hole TH1, may be inclined at the second angle θ2 with respect to the one surface of the protective film 200, for example, the lower surface of the protective film 200. The second angle θ2 may be an acute angle.

Because the first through-hole TH1 is not covered by the cover window 500, the sensor device SED may be exposed to the outside. Therefore, in order to protect the sensor device SED from foreign matter, the through-hole cover 512 covering the first through-hole TH1 may be disposed on the cover window 500.

The through-hole cover 512 may be attached to one surface of the cover window 500, for example, the upper surface of the cover window 500. The through-hole cover 512 is made of a transparent material and may include (e.g., be), for example, plastic.

The through-hole cover 512 may include a first sub cover 512a inserted into the first through-hole TH1, and second sub covers 512b extending from side surfaces of the first sub cover 512a and disposed on one surface of the cover window 500. A thickness of the first sub cover 512a may be thicker than a thickness of the second sub cover 512b.

A sixth adhesive member 760 may be disposed between the cover window 500 and the second sub cover 512b to be adhered to the cover window 500 and the second sub cover 512b. The sixth adhesive member 760 may be a pressure sensitive adhesive (PSA).

The window protective film 510 may be disposed on one surface (e.g., an upper surface) of the cover window 500 and one surface (e.g., an upper surface) of the through-hole cover 512.

Although not shown in FIGS. 14 and 15, a cross section of the side wall of the first through-hole TH1 may be formed in a step shape. For example, the section CP200 of the protective film 200 and the section CP710 of the first adhesive member 710 may be connected to (e.g., aligned with) each other, while the section CP710 of the first adhesive member 710 and the section CP100 of the display panel 100 may be cut off from (e.g., shifted away, or spaced apart, from) each other. In addition, the section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. In addition, the section CP300 of the polarizing film 300 and the section CP730 of the third adhesive member 730 may be connected to (e.g., aligned with) each other, while the section CP730 of the third adhesive member 730 and the section CP400 of the buffer layer 400 may be cut off from (e.g., shifted away, or spaced apart, from) each other. The section CP400 of the buffer layer 400 and the section CP740 of the fourth adhesive member 740 may be connected to (e.g., aligned with) each other, while the section CP740 of the fourth adhesive member 740 and the section of the cover window 500 may be cut off from (e.g., shifted away, or spaced apart, from) each other.

Figure 16:
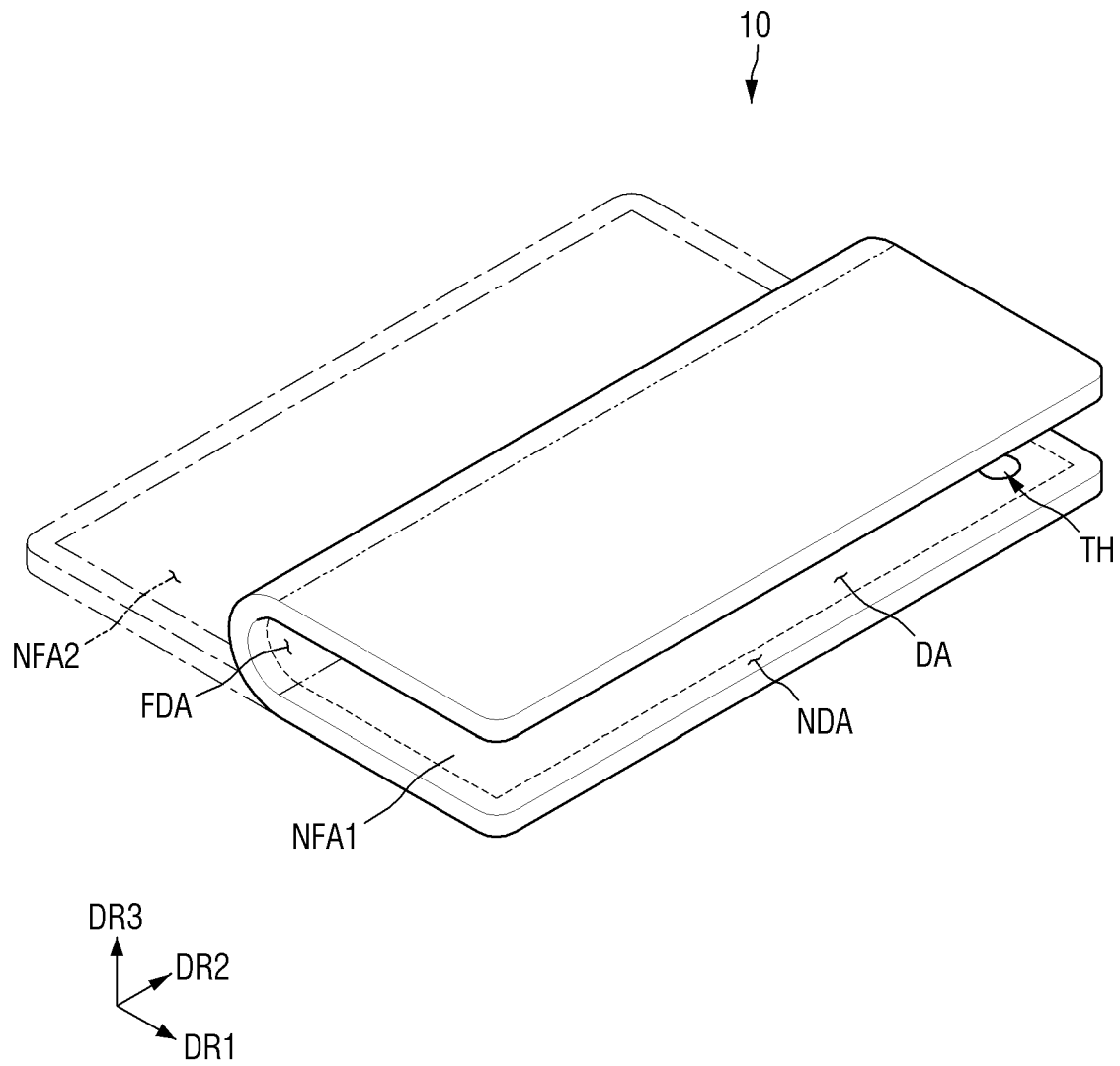
FIG. 16 is a perspective view illustrating a foldable display device in a folded state according to an embodiment.

FIG. 16 is a perspective view illustrating a foldable display device in a folded state according to an embodiment.

An embodiment in FIG. 16 differs from an embodiment in FIG. 2 in that the foldable display device 10 is folded in an in-folding manner.

Referring to FIG. 16, the foldable display device 10 may be folded in the in-folding manner in which the display area DA is disposed inside (e.g., faces the inside), as shown in FIG. 16. When the foldable display device 10 is folded in the in-folding manner, the display areas DA may be disposed to face each other. For example, two portions of the display area DA may face each other.

Figure 17:
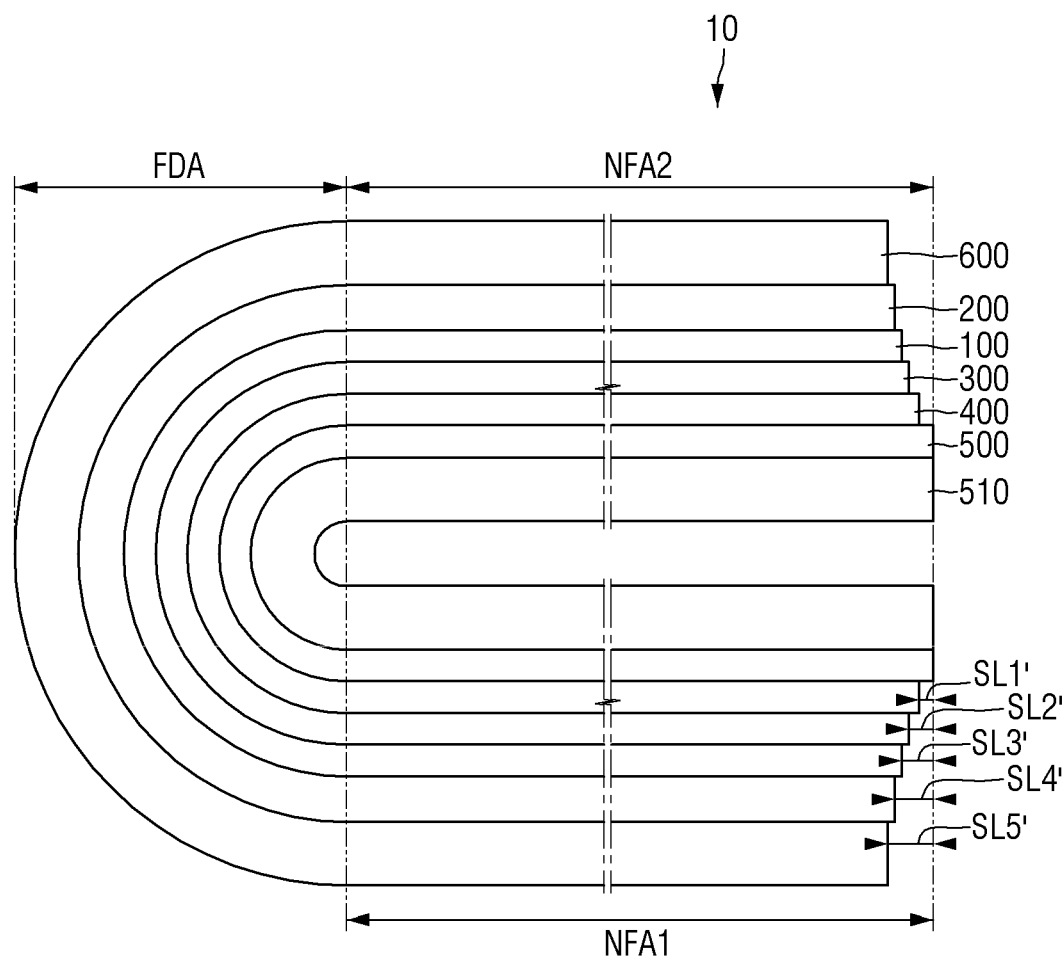
FIG. 17 is a side view illustrating a foldable display device in a folded state according to an embodiment.

FIG. 17 is a side view illustrating a foldable display device in a folded state according to an embodiment.

An embodiment in FIG. 17 differs from an embodiment in FIG. 4 in that an amount of slip increases as a component is disposed adjacent the lower portion of the display device 10. For example, the amount of slip is greater for layers closer to the lower surface of the display device than for layers closer to the upper surface of the display device 10.

Referring to FIG. 17, when the display device 10 is folded in the in-folding manner as shown in FIG. 16, the display panel 100, the protective film 200, the polarizing film 300, the buffer layer 400, the cover window 500, the window protective film 510, and the bottom panel cover 600 of the display device 10 are bent in the folding area FDA. As a result, stress may be applied to the display panel 100, the protective film 200, the polarizing film 300, the buffer layer 400, the cover window 500, the window protective film 510, and the bottom panel cover 600 of the display device 10. Accordingly, a slip phenomenon may occur in which one end of the display panel 100, one end of the protective film 200, one end of the polarizing film 300, one end of the buffer layer 400, one end of the cover window 500, one end of the window protective film 510, and one end of the bottom panel cover 600, are not aligned in the second direction DR2.

Here, because the applied stress increases as a component is disposed adjacent a lower portion of the display device 10, the amount of slip may increase. As shown in FIG. 17, one end of the buffer layer 400 may be shorter than (e.g., shifted away, or spaced apart, from) one end of the cover window 500 by a first slip length SL1'. One end of the polarizing film 300 may be shorter than (e.g., shifted away, or spaced apart, from) the one end of the cover window 500 by a second slip length SL2' longer (e.g., greater) than the first slip length SL1'. One end of the display panel 100 may be shorter than (e.g., shifted away, or spaced apart, from) the one end of the cover window 500 by a third slip length SL3' longer (e.g., greater) than the second slip length SL2'. One end of the protective film 200 may be shorter than (e.g., shifted away, or spaced apart, from) the one end of the cover window 500 by a fourth slip length SL4' longer (e.g., greater) than third slip length SL3'. One end of the bottom panel cover 600 may be shorter than (e.g., shifted away, or spaced apart, from) the one end of the cover window 500 by a fifth slip length SL5' longer (e.g., greater) than the fourth slip length SL4'.

Figure 18:
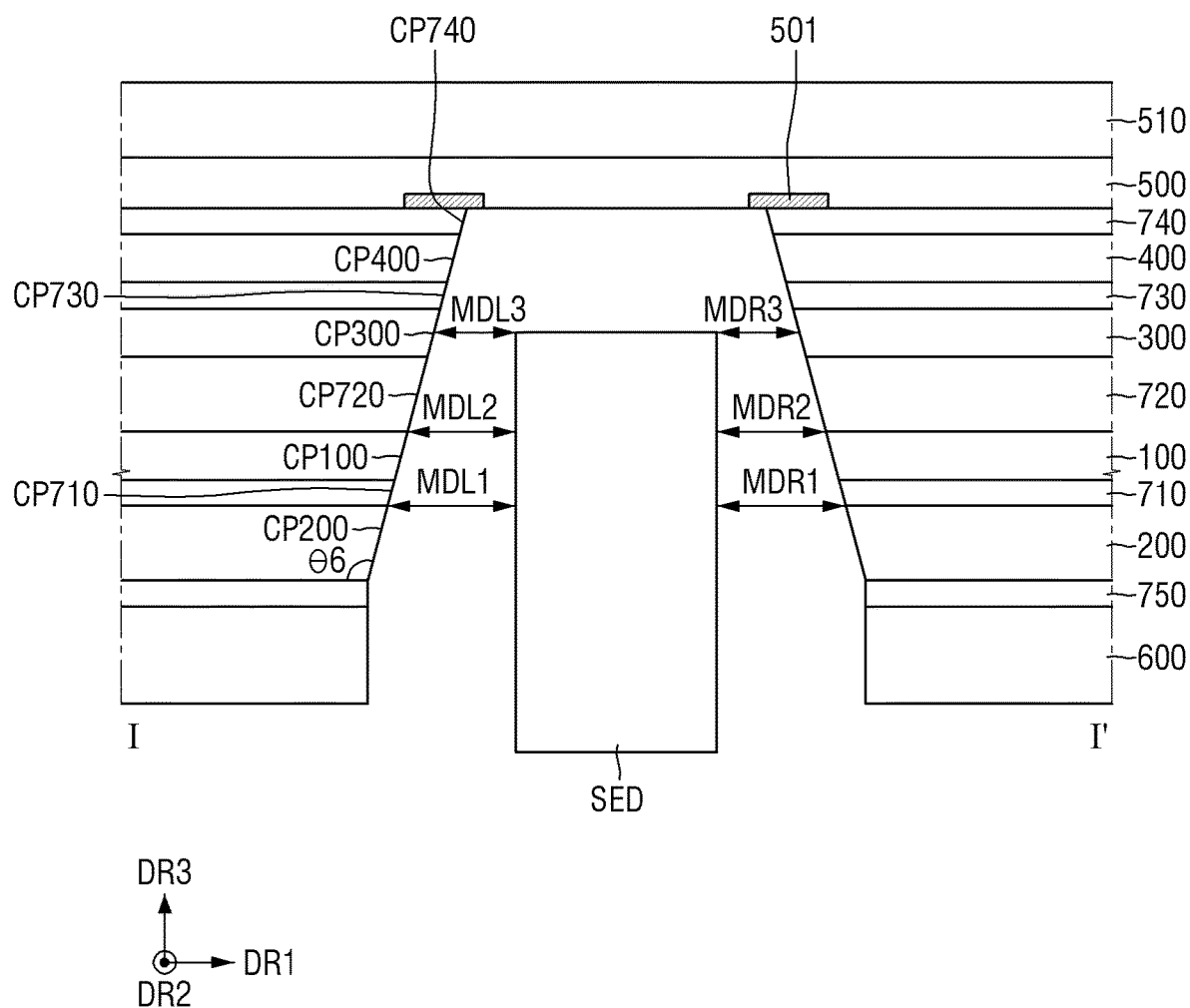
FIG. 18 is a cross-sectional view illustrating an example of a through-hole area of a foldable display device in an unfolded state according to an embodiment.
Figure 19:
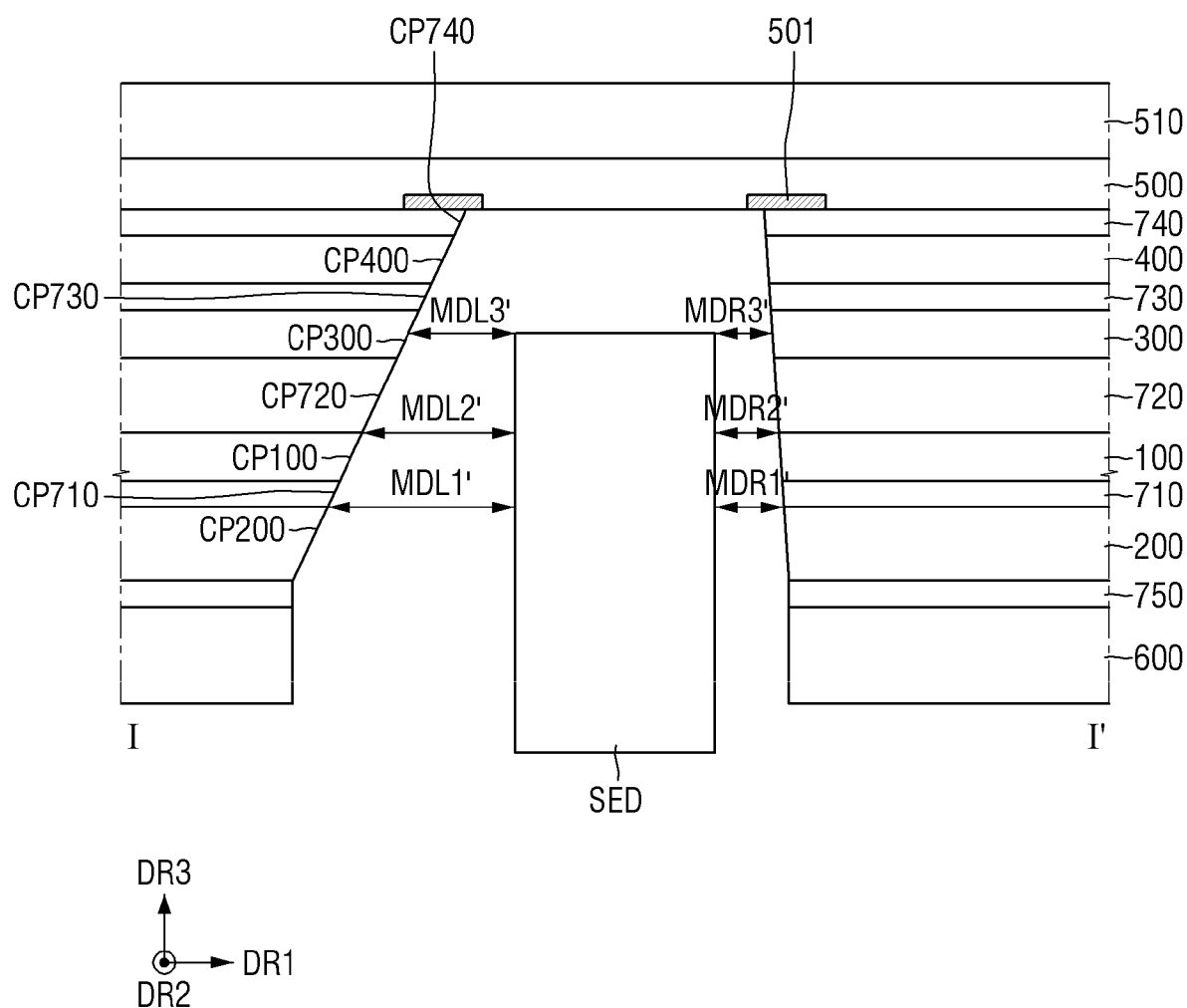
FIG. 19 is a cross-sectional view illustrating an example of a through-hole area of a foldable display device in a folded state according to an embodiment.

FIG. 18 is a cross-sectional view illustrating an example of a through-hole area of a foldable display device in an unfolded state according to an embodiment. FIG. 19 is a cross-sectional view illustrating an example of a through-hole area of a foldable display device in a folded state according to an embodiment.

Embodiments in FIGS. 18 and 19 differ from embodiments in FIGS. 7 and 8 in that the first through-hole TH1 widens from the other surface of the display module 11 facing the cover window 500 toward the one surface of the display module 11 facing the bottom panel cover 600.

Referring to FIGS. 18 and 19, when the display device 10 is folded in the in-folding manner, the amount of slip may increase as a component is disposed adjacent the lower portion of the display device 10. Accordingly, in order to prevent or reduce interference between the polarizing film 300 and the sensor device SED when the display device 10 is in the folded state, the first through-hole TH1 may be formed most widely at (e.g., on) one surface (e.g., a lower surface) of the display module 11 and may be formed most narrowly at (e.g., on) the other surface (e.g., an upper surface) of the display module 11. For example, when the display device 10 is unfolded as shown in FIG. 18, the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740, which form the side wall of the first through-hole TH1, may be inclined at a sixth angle θ6 with respect to the one surface of the protective film 200, for example, the lower surface of the protective film 200. The sixth angle θ6 may be an obtuse angle.

In addition, in the unfolded state of the display device 10 as shown in FIG. 18, a minimum distance MDR1/MDL1 between the protective film 200 and the sensor device SED may be longer (e.g., greater) than a minimum distance MDR2/MDL2 between the display panel 100 and the sensor device SED, and a minimum distance MDR3/MDL3 between the polarizing film 300 and the sensor device SED may be longer (e.g., greater) than a minimum distance MDR2/MDL2 between the display panel 100 and the sensor device SED.

In the unfolded state of the display device 10 as shown in FIG. 18, a minimum distance MDR1 between the protective film 200 and the right side of the sensor device SED and a minimum distance MDL1 between the protective film 200 and the left side of the sensor device SED may be the same or substantially the same. In addition, in the unfolded state of the display device 10, a minimum distance MDR2 between the display panel 100 and the right side of the sensor device SED and a minimum distance MDL2 between the display panel 100 and the left side of the sensor device SED may be the same or substantially the same. In addition, in the unfolded state of the display device 10, a minimum distance MDR3 between the polarizing film 300 and the right side of the sensor device SED and a minimum distance MDL3 between the polarizing film 300 and the left side of the sensor device SED may be the same or substantially the same.

In the unfolded state of the display device 10 as shown in FIG. 18, the minimum distance MDR1/MDL1 between the protective film 200 and the sensor device SED differs from a minimum distance MDR1'/MDL1' between the protective film 200 and the sensor device SED in the folded state of the display device 10, as shown in FIG. 19. For example, in the unfolded state of the display device 10 as shown in FIG. 18, a minimum distance MDR1 between the right side of the sensor device SED and the protective film 200 may be longer (e.g., greater) than a minimum distance MDR1' between the right side of the sensor device SED and the protective film 200 in the folded state of the display device 10, as shown in FIG. 19. In addition, in the unfolded state of the display device 10 as shown in FIG. 18, a minimum distance MDL1 between the left side of the sensor device SED and the protective film 200 may be shorter (e.g., less) than a minimum distance MDL1' between the left side of the sensor device SED and the protective film 200 in the folded state of the display device 10, as shown in FIG. 19.

In addition, in the unfolded state of the display device 10 as shown in FIG. 18, the minimum distance MDR2/MDL2 between the display panel 100 and the sensor device SED may differ from a minimum distance MDR2'/MDL2' between the display panel 100 and the sensor device SED in the folded state of the display device 10, as shown in FIG. 19. Further, in the unfolded state of the display device 10 as shown in FIG. 18, a minimum distance MDR3/MDL3 between the polarizing film 300 and the sensor device SED may differ from a minimum distance MDR3'/MDL3' between the polarizing film 300 and the sensor device SED in the folded state of the display device 10, as shown in FIG. 19.

When the first through-hole TH1 widens from the other surface of the display module 11 facing the cover window 500 toward the one surface of the display module 11 facing the bottom panel cover 600, it is possible to prevent or reduce interference between the components of the display device 10 and the sensor device SED even if the protective film 200, the display panel 100, the polarizing film 300, and the buffer layer 400 of the display module 11 slip when the display device 10 is folded in the in-folding manner, as shown in FIG. 19.

Figure 20:
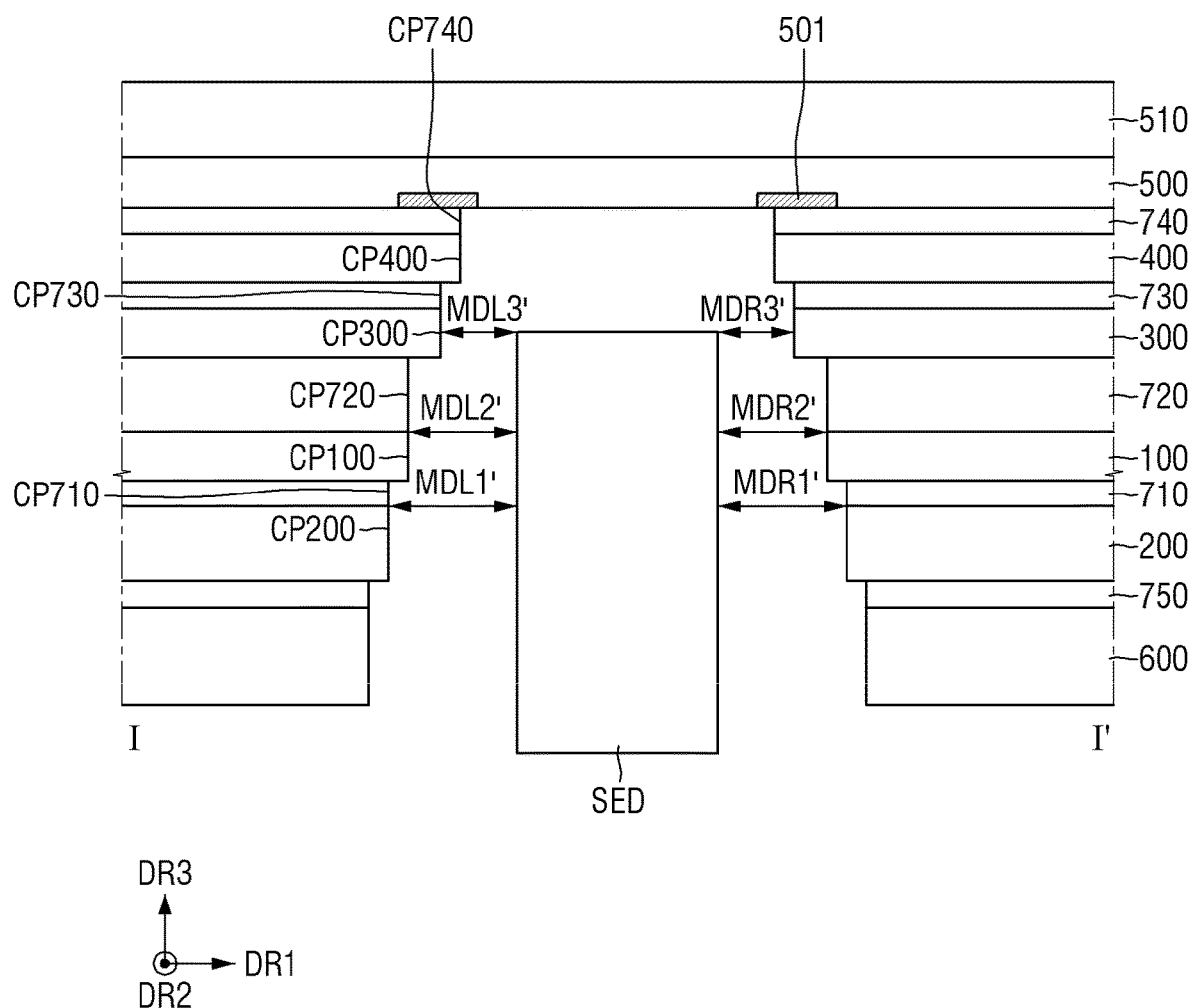
FIG. 20 is a cross-sectional view illustrating an example of a through-hole area of a foldable display device in an unfolded state according to an embodiment.
Figure 21:
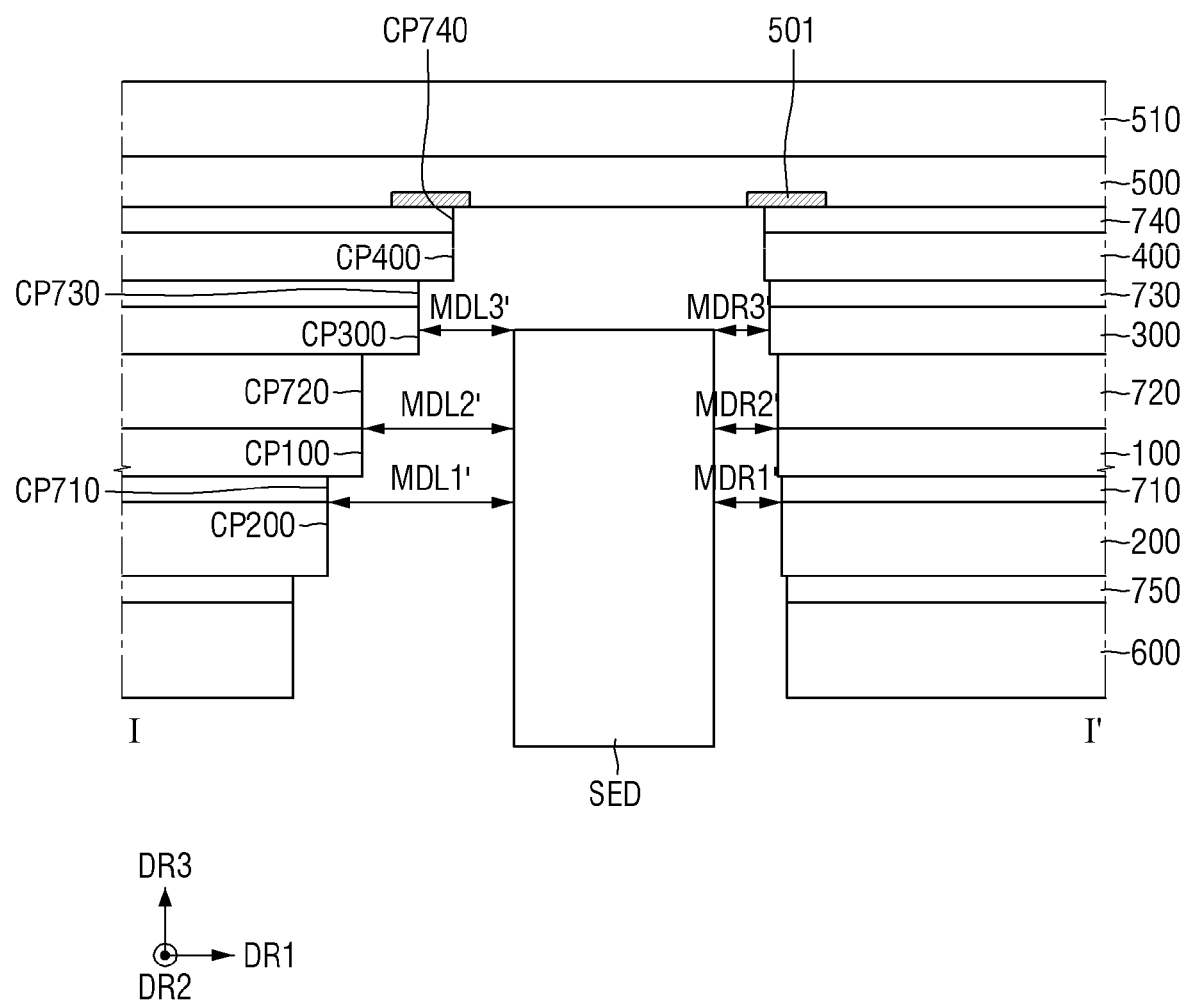
FIG. 21 is a cross-sectional view illustrating an example of a through-hole area of a foldable display device in a folded state according to an embodiment.

FIG. 20 is a cross-sectional view illustrating an example of a through-hole area of a foldable display device in an unfolded state according to an embodiment. FIG. 21 is a cross-sectional view illustrating an example of a through-hole area of a foldable display device in a folded state according to an embodiment.

Embodiments in FIGS. 20 and 21 differ from embodiments in FIGS. 18 and 19 in that a cross section of a side wall of the first through-hole TH1 is formed in a step shape.

Referring to FIGS. 20 and 21, the side wall of the first through-hole TH1 may be made of the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740. The section CP200 of the protective film 200 and the section CP710 of the first adhesive member 710 may be connected to (e.g., aligned with) each other, while the section CP710 of the first adhesive member 710 and the section CP100 of the display panel 100 may be cut off from (e.g., shifted away, or spaced apart, from) each other. In addition, the section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. In addition, the section CP300 of the polarizing film 300 and the section CP730 of the third adhesive member 730 may be connected to (e.g., aligned with) each other, while the section CP730 of the third adhesive member 730 and the section CP400 of the buffer layer 400 may be cut off from (e.g., shifted away, or spaced apart, from) each other. The section CP400 of the buffer layer 400 and the section CP740 of the fourth adhesive member 740 may be connected to (e.g., aligned with) each other. As a result, a cross section of the side wall of the first through-hole TH1 may have a step shape.

When the first through-hole TH1 widens from the other surface of the display module 11 facing the cover window 500 toward the one surface of the display module 11 facing the bottom panel cover 600, it is possible to prevent or reduce interference between the components of the display device 10 and the sensor device SED even if the protective film 200, the display panel 100, the polarizing film 300, and the buffer layer 400 of the display module 11 slip when the display device 10 is folded in the in-folding manner as shown in FIG. 21.

Figure 22:
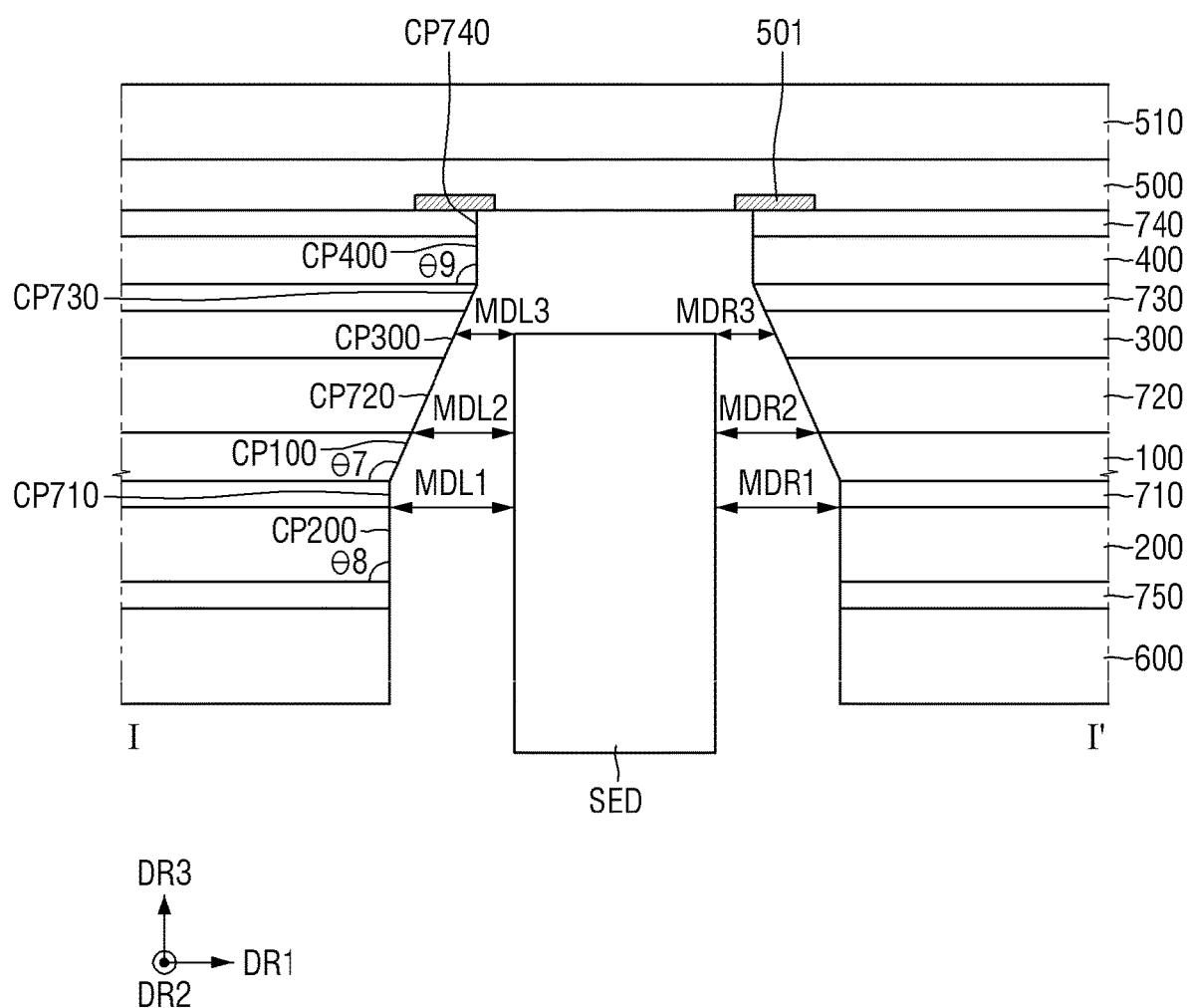
FIG. 22 is a cross-sectional view illustrating an example of a through-hole area of a foldable display device in an unfolded state according to an embodiment.
Figure 23:
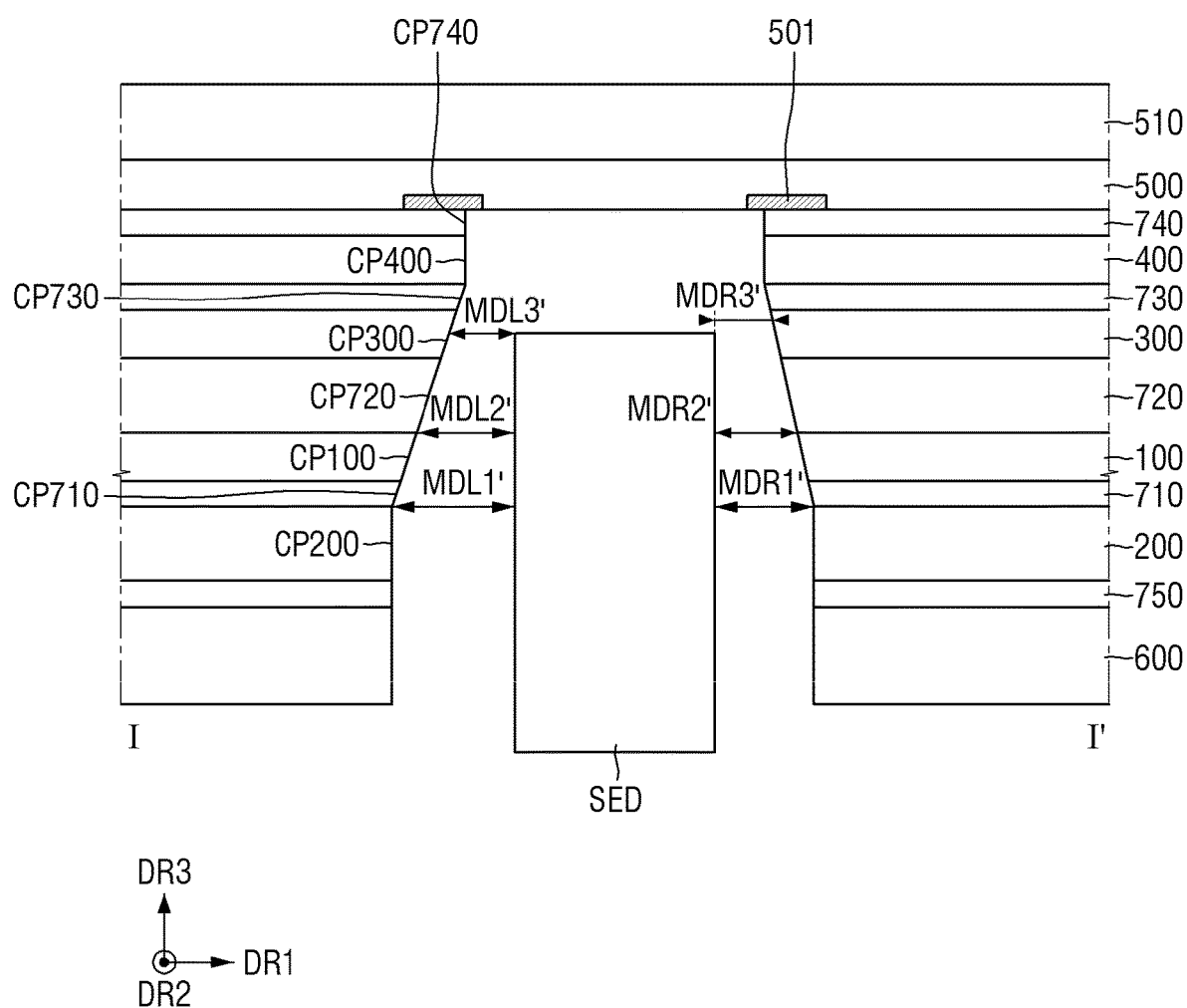
FIG. 23 is a cross-sectional view illustrating an example of a through-hole area of a foldable display device in a folded state according to an embodiment.

FIG. 22 is a cross-sectional view illustrating an example of a through-hole area of a foldable display device in an unfolded state according to an embodiment. FIG. 23 is a cross-sectional view illustrating an example of a through-hole area of a foldable display device in a folded state according to an embodiment.

Embodiments in FIGS. 22 and 23 differ from embodiments in FIGS. 18 and 19 in that only a portion of the first through-hole TH1 widens.

Referring to FIGS. 22 and 23, the side wall of the first through-hole TH1 may be made of (e.g., formed from) the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740.

The section CP100 of the display panel 100, the section CP720 of the second adhesive member 720, the section CP300 of the polarizing film 300, and the section CP730 of the third adhesive member 730 may be inclined at a seventh angle θ7 with respect to one surface of the display panel 100, for example, the lower surface of the display panel 100. The seventh angle θ7 may be an obtuse angle.

The section CP200 of the protective film 200 and the section CP710 of the first adhesive member 710 may be inclined at an eighth angle θ8 relative to one surface of the protective film 200, for example, the lower surface of the protective film 200. The eighth angle θ8 may be an angle smaller than the seventh angle θ7. For example, the eighth angle θ8 may be a right angle.

The section CP400 of the buffer layer 400 and the section CP740 of the fourth adhesive member 740 may be inclined at a ninth angle θ9 with respect to one surface of the buffer layer 400, for example, a lower surface of the buffer layer 400. The ninth angle θ9 may be an angle smaller than the seventh angle θ7. For example, the ninth angle θ9 may be a right angle.

When the first through-hole TH1 widens from the other surface of the display module 11 facing the cover window 500 toward the one surface of the display module 11 facing the bottom panel cover 600, it is possible to prevent or reduce interference between the components of the display device 10 and the sensor device SED even if the protective film 200, the display panel 100, the polarizing film 300, and the buffer layer 400 of the display module 11 slip when the display device 10 is folded in the out-folding manner as shown in FIG. 23.

Although not shown in FIGS. 22 and 23, a cross section of a portion of the side wall of the first through-hole TH1 may be formed in a step shape. For example, the section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. The section CP300 of the polarizing film 300 and the section CP730 of the third adhesive member 730 may be connected to (e.g., aligned with) each other. As a result, a cross section of the portion of the side wall of the first through-hole TH1 may have a step shape.

Figure 24:
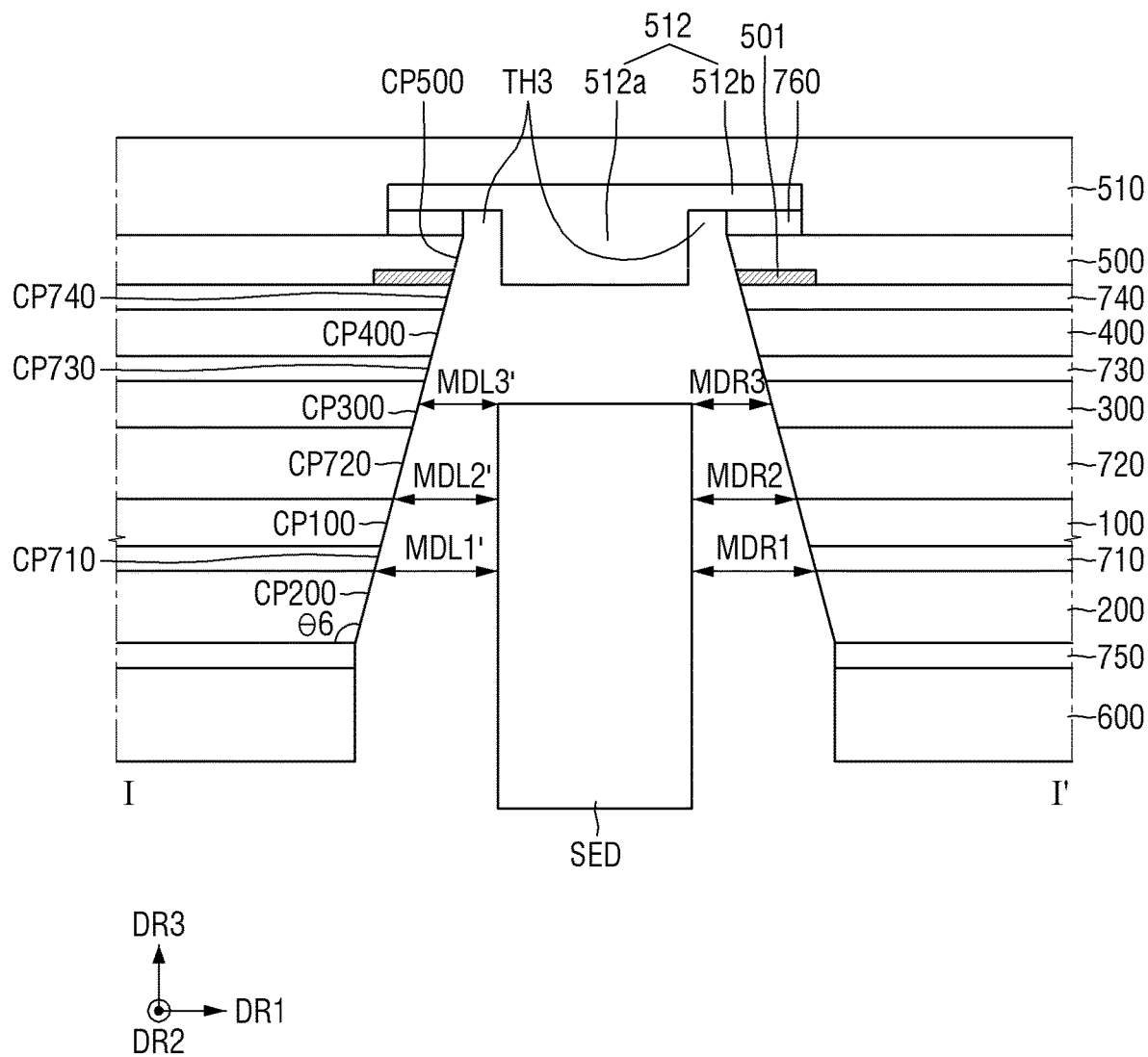
FIG. 24 is a cross-sectional view illustrating an example of a through-hole area of a foldable display device in an unfolded state according to an embodiment.
Figure 25:
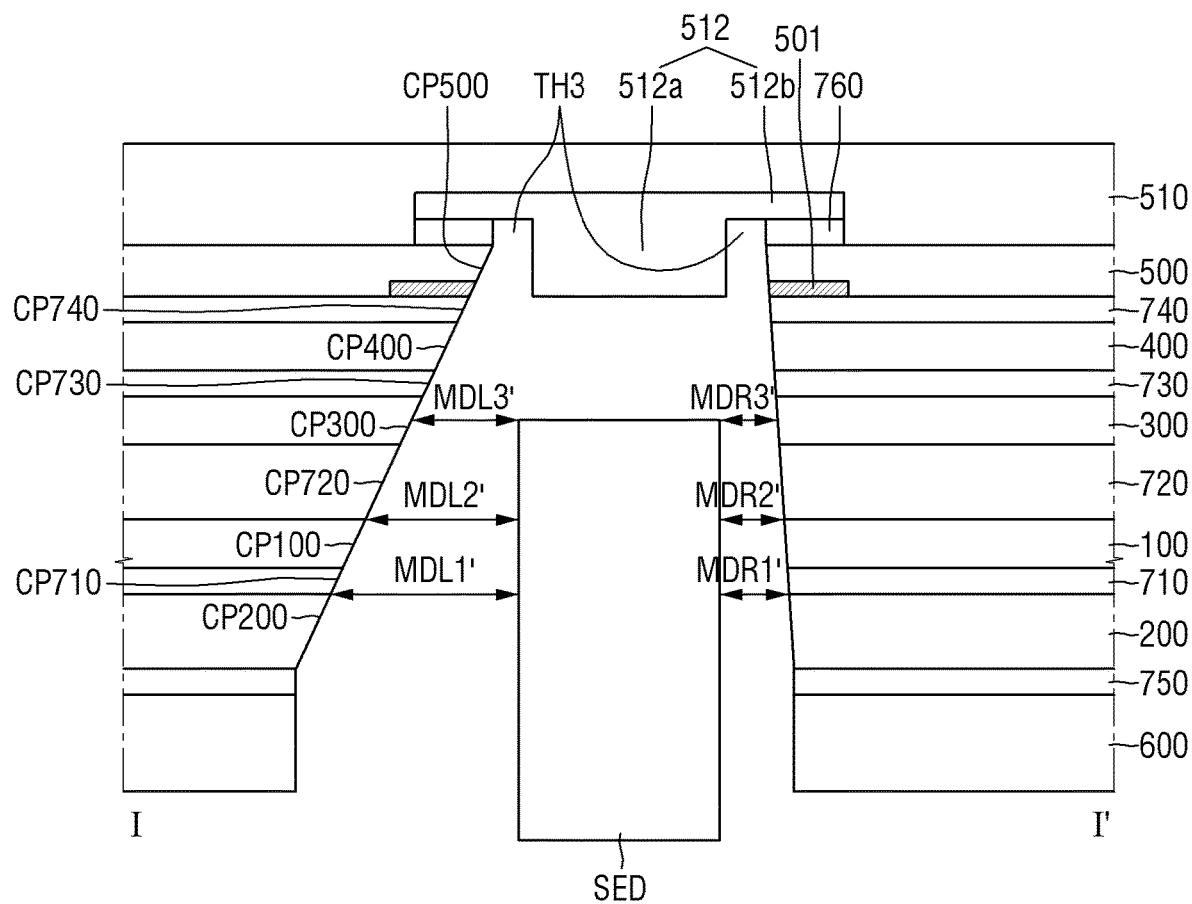
FIG. 25 is a cross-sectional view illustrating an example of a through-hole area of a foldable display device in a folded state according to an embodiment.
Figure 25:
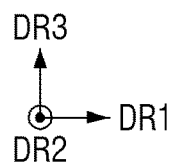

FIG. 24 is a cross-sectional view illustrating an example of a through-hole area of a foldable display device in an unfolded state according to an embodiment. FIG. 25 is a cross-sectional view illustrating an example of a through-hole area of a foldable display device in a folded state according to an embodiment.

Embodiments in FIGS. 24 and 25 differ from embodiments in FIGS. 18 and 19 in that the first through-hole TH1 penetrates the cover window 500, and the through-hole cover 512 is disposed on the cover window 500 to cover the third through-hole TH3.

Referring to FIGS. 24 and 25, the section CP200 of the protective film 200, the section CP710 of the first adhesive member 710, the section CP100 of the display panel 100, the section CP720 of the second adhesive member 720, the section CP300 of the polarizing film 300, the section CP730 of the third adhesive member 730, the section CP400 of the buffer layer 400, the section CP740 of the fourth adhesive member 740, and a section of the cover window 500, which form the side wall of the first through-hole TH1, may be inclined at the sixth angle θ6 with respect to the one surface of the protective film 200, for example, the lower surface of the protective film 200. The sixth angle θ6 may be an obtuse angle.

Because the first through-hole TH1 is not covered by the cover window 500, the sensor device SED may be exposed to the outside. Therefore, in order to protect the sensor device SED from foreign matter, the through-hole cover 512 covering the first through-hole TH1 may be disposed on the cover window 500.

The through-hole cover 512 may be attached to one surface of the cover window 500, for example, the upper surface of the cover window 500. The through-hole cover 512 is made of a transparent material and may include (e.g., be), for example, plastic.

The through-hole cover 512 may include a first sub cover 512*a* inserted into the first through-hole TH1, and second sub covers 512*b* extending from side surfaces of the first sub cover 512*a* and disposed on one surface (e.g., an upper surface) of the cover window 500. A thickness of the first sub cover 512*a* may be thicker (e.g., greater) than a thickness of the second sub cover 512*b*.

The sixth adhesive member 760 may be disposed between the cover window 500 and the second sub cover 512*b* to be adhered to the cover window 500 and the second sub cover 512*b*. The sixth adhesive member 760 may be a pressure sensitive adhesive (PSA).

The window protective film 510 may be disposed on one surface of the cover window 500 and one surface of the through-hole cover 512.

Although not shown in FIGS. 24 and 25, a cross section of the side wall of the first through-hole TH1 may be formed in a step shape. For example, the section CP200 of the protective film 200 and the section CP710 of the first adhesive member 710 may be connected to (e.g., aligned with) each other, while the section CP710 of the first adhesive member 710 and the section CP100 of the display panel 100 may be cut off from (e.g., shifted away, or spaced apart, from) each other. In addition, the section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. In addition, the section CP300 of the polarizing film 300 and the section CP730 of the third adhesive member 730 may be connected to (e.g., aligned with) each other, while the section CP730 of the third adhesive member 730 and the section CP400 of the buffer layer 400 may be cut off from (e.g., shifted away, or spaced apart, from) each other. The section CP400 of the buffer layer 400 and the section CP740 of the fourth adhesive member 740 may be connected to (e.g., aligned with) each other, while the section CP740 of the fourth adhesive member 740 and the section of the cover window 500 may be cut off from (e.g., shifted away, or spaced apart, from) each other.

Figure 26:
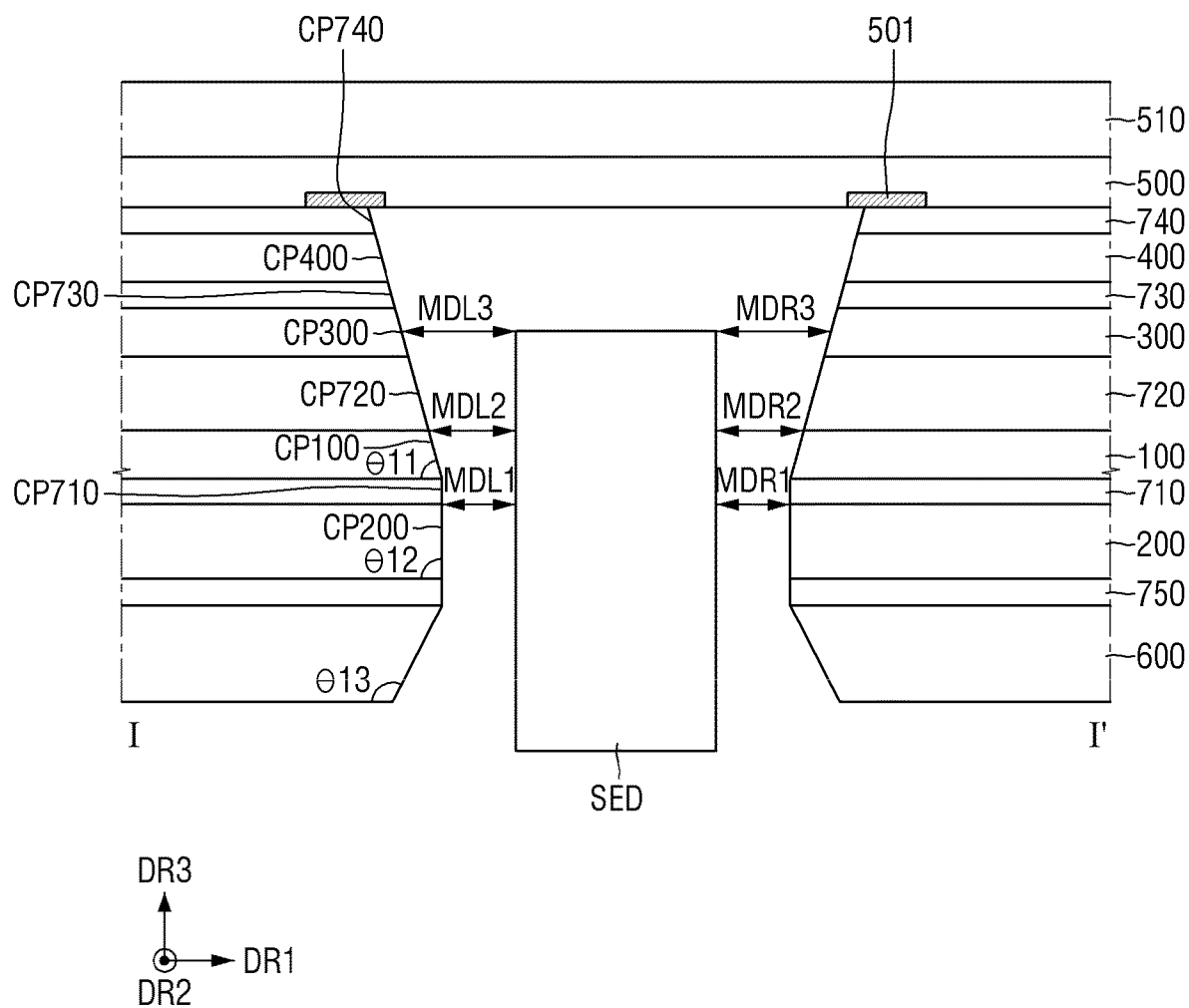
FIG. 26 is a cross-sectional view illustrating an example of a through-hole area of a foldable display device in an unfolded state according to an embodiment.
Figure 27:
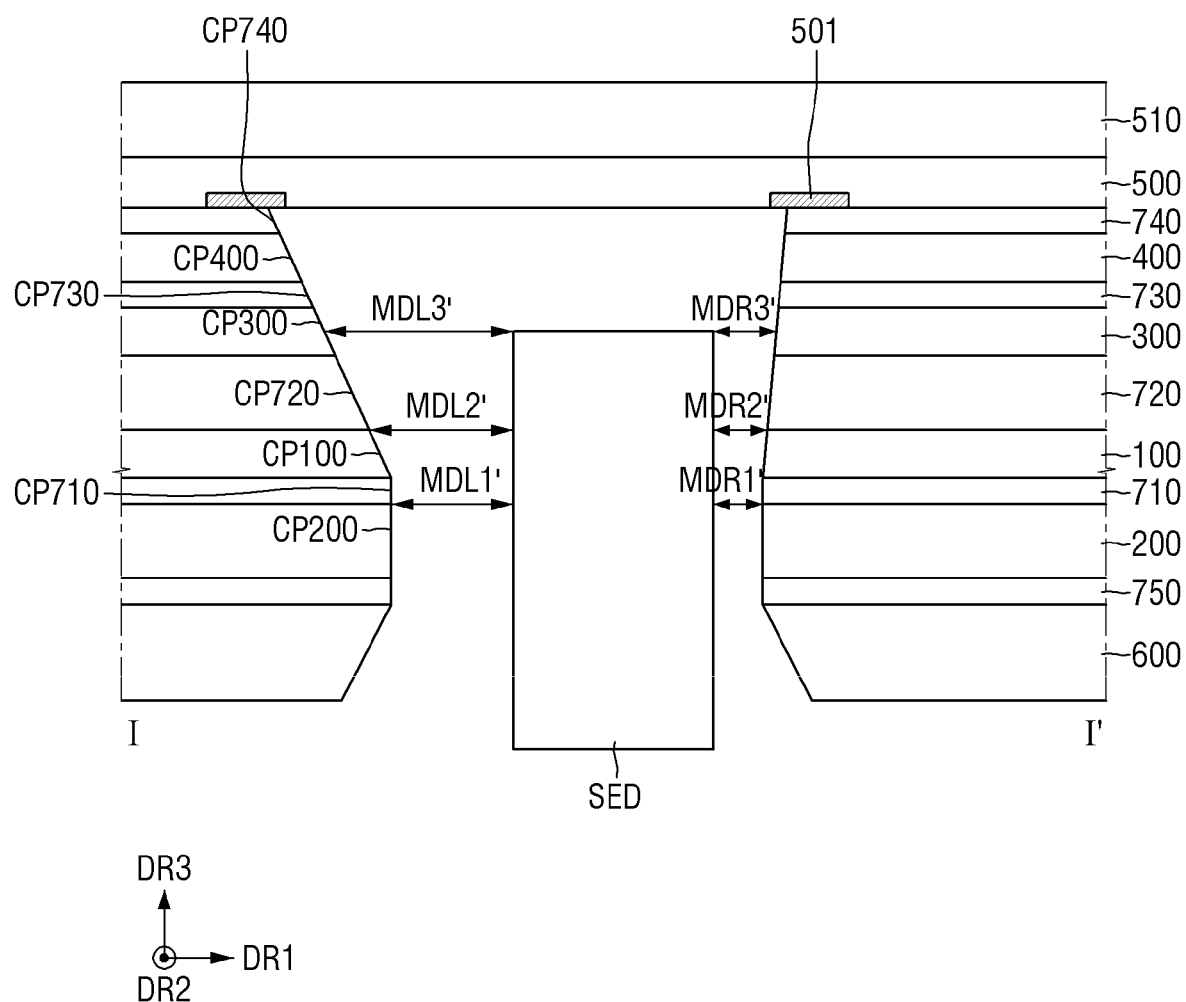
FIG. 27 is a cross-sectional view illustrating an example of a through-hole area of a foldable display device in a state where the foldable display device is folded in an out-folding manner according to an example embodiment.
Figure 28:
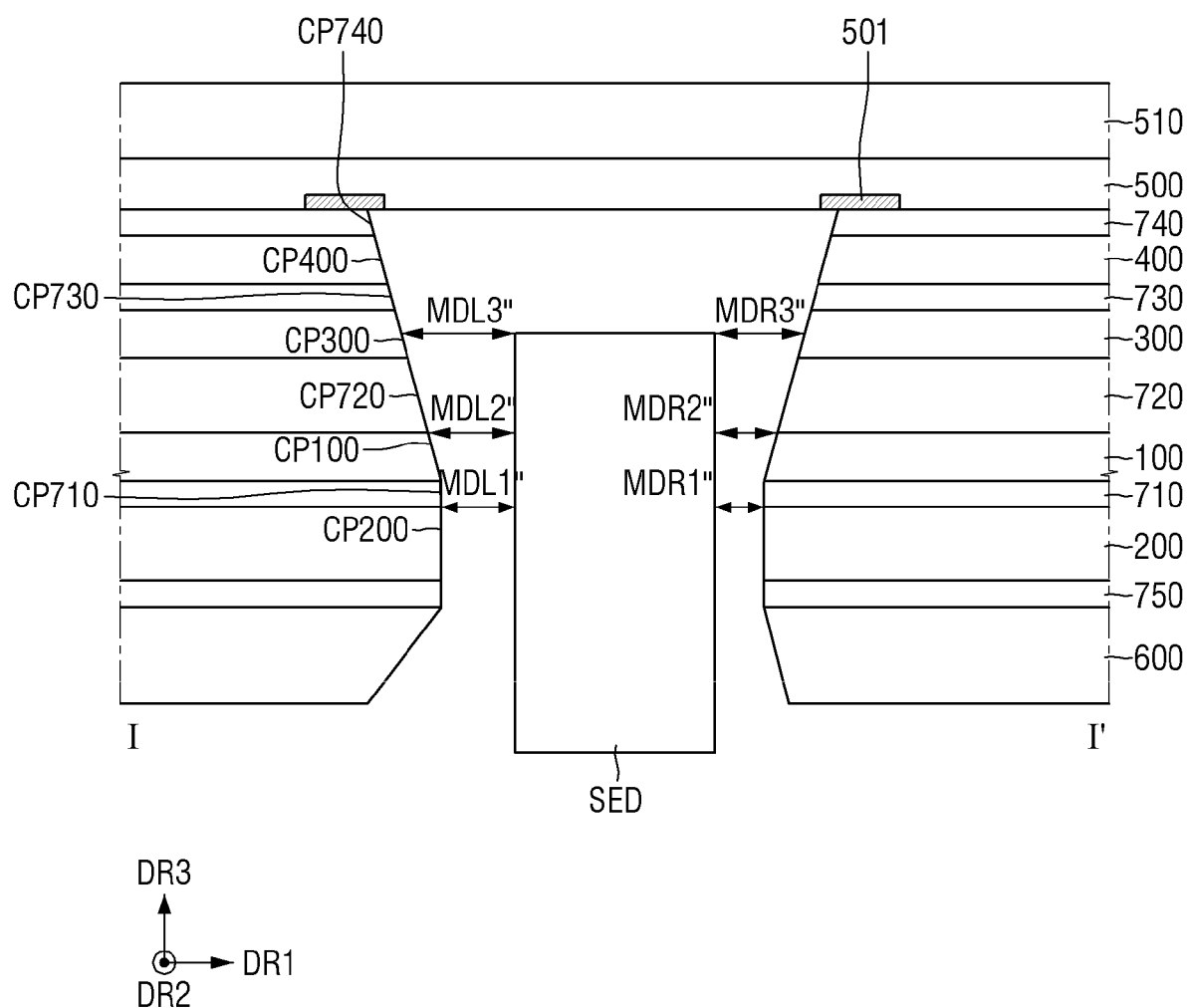
FIG. 28 is a cross-sectional view illustrating an example of a through-hole area of a foldable display device in a state where the foldable display device is folded in an in-folding manner according to an embodiment.

FIG. 26 is a cross-sectional view illustrating an example of a through-hole area of a foldable display device in an unfolded state according to an embodiment. FIG. 27 is a cross-sectional view illustrating an example of a through-hole area of a foldable display device in a state where the foldable display device is folded in an out-folding manner according to an embodiment. FIG. 28 is a cross-sectional view illustrating an example of a through-hole area of a foldable display device in a state where the foldable display device is folded in an in-folding manner according to an embodiment.

Embodiments in FIGS. 26 to 28 differ in that a portion of the first through-hole TH1 widens from one surface of the display module 11 facing the bottom panel cover 600 (e.g., from a lower surface of the display panel 100) toward the other surface of the display module 11 facing the cover window 500, and the second through-hole TH2 widens from one surface of the bottom panel cover 600 facing one surface of the display module 11 toward the other surface which is the opposite surface of the one surface of the bottom panel cover 600. For example, a portion of the second through-hole TH2 may widen from an upper surface of the fifth insulating layer 750, or from an upper surface of the bottom panel cover 600, toward a lower surface of the bottom panel cover 600.

Referring to FIGS. 26 to 28, the section CP100 of the display panel 100, the section CP720 of the second adhesive member 720, the section CP300 of the polarizing film 300, the section CP730 of the third adhesive member 730, the section CP400 of the buffer layer 400, and the section CP740 of the fourth adhesive member 740 may be inclined at an eleventh angle θ11 with respect to one surface of the display panel 100, for example, the lower surface of the display panel 100. The eleventh angle θ11 may be an acute angle.

The section CP200 of the protective film 200 and the section CP710 of the first adhesive member 710 may be inclined at a twelfth angle θ12 relative to one surface of the protective film 200, for example, the lower surface of the protective film 200. The twelfth angle θ12 may be an angle greater than the eleventh angle θ11. For example, the twelfth angle θ12 may be a right angle.

The section CP600 of the bottom panel cover 600 may be inclined at a thirteenth angle θ13 with respect to the other surface of the bottom panel cover 600, for example, the lower surface of the bottom panel cover 600. The thirteenth angle θ13 may be an obtuse angle. In some embodiments, a section CP750 of the fifth insulating layer 750 may be inclined at either the thirteenth angle θ13 or at the twelfth angle θ12, but the section CP750 of the fifth insulating layer 750 is not limited thereto.

When the first through-hole TH1 widens from the one surface of the display module 11 facing the bottom panel cover 600 toward the other surface of the display module 11 facing the cover window 500, it is possible to prevent or reduce interference between the components of the display device 10 and the sensor device SED even if the protective film 200, the display panel 100, the polarizing film 300, and the buffer layer 400 of the display module 11 slip when the display device 10 is folded in the out-folding state as shown in FIG. 27.

In addition, when the second through-hole TH2 widens from one surface of the bottom panel cover 600 to the other surface of the bottom panel cover 600, it is possible to prevent or reduce interference between the components of the display device 10 and the sensor device SED even if the bottom panel cover 600 and the fifth insulating layer 750 slip when the display device 10 is folded in the in-folding state as shown in FIG. 28.

According to embodiments in FIGS. 26 to 28, it is possible to prevent or reduce the interference between the components of the display device 10 and the sensor device SED even if the protective film 200, the display panel 100, the polarizing film 300, and the buffer layer 400 of the display module 11, and in some embodiments, also the bottom panel cover 600, slip, regardless of whether the display device 10 is folded in the out-folding manner or the in-folding manner.

Although not shown in FIGS. 26 to 28, the cross section of the through-hole TH may be formed in a step shape. For example, the section CP200 of the protective film 200 and the section CP710 of the first adhesive member 710 may be connected to (e.g., aligned with) each other, while the section CP710 of the first adhesive member 710 and the section CP100 of the display panel 100 may be cut off from (e.g., shifted away, or spaced apart, from) each other. The section CP100 of the display panel 100 and the section CP720 of the second adhesive member 720 may be connected to (e.g., aligned with) each other, while the section CP720 of the second adhesive member 720 and the section CP300 of the polarizing film 300 may be cut off from (e.g., shifted away, or spaced apart, from) each other. The section CP300 of the polarizing film 300 and the section CP730 of the third adhesive member 730 may be connected to (e.g., aligned with) each other, while the section CP730 of the third adhesive member 730 and the section CP400 of the buffer layer 400 may be cut off from (e.g., shifted away, or spaced apart, from) each other. The section CP400 of the buffer layer 400 and the section CP740 of the fourth adhesive member 740 may be connected to (e.g., aligned with) each other. In addition, the section CP200 of the protective film 200 and the section CP750 of the fifth adhesive member 750 may be connected to (e.g., aligned with) each other, while the section CP750 of the fifth adhesive member 750 and the section CP600 of the bottom panel cover 600 may be cut off from (e.g., shifted away, or spaced apart, from) each other.

Although some embodiments of the present disclosure have been disclosed for illustrative purposes, those skilled in the art will appreciate that various modifications, additions and substitutions are possible, without departing from the scope and spirit of the disclosure as defined by the accompanying claims and equivalents thereof.

What is claimed is:

1. A display device, comprising:
    a sensor device;
    a display module to display an image and having a first through-hole in which the sensor device is positioned; and
    a bottom panel cover on one surface of the display module and having a second through-hole in which the sensor device is positioned,
    wherein the first through-hole has breadth that increases from the one surface of the display module toward another surface of the display module opposite to the one surface of the display module.

2. The display device of claim 1, wherein a maximum breadth of the second through-hole is smaller than a maximum breadth of the first through-hole.

3. The display device of claim 1, wherein the display module comprises:
    a display panel including pixels to display the image;
    a protective film on one surface of the display panel; and
    a first adhesive member between the display panel and the protective film.

4. The display device of claim 3, wherein a minimum distance between the protective film and the sensor device is less than a minimum distance between the display panel and the sensor device.

5. The display device of claim 3, wherein a minimum distance between the protective film and the sensor device when the display module is folded differs from a minimum distance between the protective film and the sensor device when the display module is not folded,
    wherein a first portion of the one surface of the display module faces either toward or away from a second portion of the one surface of the display module when the display module is folded, and
    wherein a first portion of the other surface of the display module faces either toward or away from a second portion of the other surface of the display module when the display module is folded.

6. The display device of claim 3, wherein the display module further comprises:
    a polarizing film on another surface of the display panel opposite to the one surface of the display panel; and
    a second adhesive member between the display panel and the polarizing film.

7. The display device of claim 6, wherein a minimum distance between the display panel and the sensor device is less than a minimum distance between the polarizing film and the sensor device.

8. The display device of claim 6, wherein a minimum distance between the polarizing film and the sensor device when the display module is folded differs from a minimum distance between the polarizing film and the sensor device when the display module is not folded,
    wherein a first portion of the one surface of the display module faces either toward or away from a second portion of the one surface of the display module when the display module is folded, and
    wherein a first portion of the other surface of the display module faces either toward or away from a second portion of the other surface of the display module when the display module is folded.

9. The display device of claim 6, wherein the display module further comprises:
    a buffer layer on one surface of the polarizing film; and
    a third adhesive member between the polarizing film and the buffer layer.

10. The display device of claim 9,
    wherein a section of the protective film, a section of the first adhesive member, a section of the display panel, a section of the second adhesive member, a section of the polarizing film, a section of the third adhesive member, and a section of the buffer layer are inclined at a first angle with respect to one surface of the protective film, and
    wherein the first angle is an acute angle.

11. The display device of claim 9, wherein a section of the protective film, a section of the first adhesive member, a section of the display panel, a section of the second adhesive member, a section of the polarizing film, a section of the third adhesive member, and a section of the buffer layer are aligned with each other.

12. The display device of claim 9, wherein a section of the protective film and a section of the display panel are spaced apart from each other, the section of the display panel and a section of the polarizing film are spaced apart from each other, and the section of the polarizing film and a section of the buffer layer are spaced apart from each other.

13. The display device of claim 9,
    wherein a section of the display panel, a section of the second adhesive member, and a section of the polarizing film are inclined at a first angle with respect to the one surface of the display panel, and
    wherein the first angle is an acute angle.

14. The display device of claim 13,
    wherein a section of the protective film is inclined at a second angle with respect to one surface of the protective film, and
    wherein the second angle is larger than the first angle.

15. The display device of claim 13,
    wherein a section of the buffer layer is inclined at a third angle with respect to one surface of the buffer layer, and
    wherein the third angle is larger than the first angle.

16. The display device of claim 1, further comprising:
    a cover window on the other surface of the display module,
    wherein the cover window covers the first through-hole.

17. The display device of claim 1, further comprising:
    a cover window on the other surface of the display module, wherein the cover window has a third through-hole overlapping the first through-hole.

18. The display device of claim 17, further comprising: a through-hole cover on one surface of the cover window and covering the third through-hole.

19. The display device of claim 3, wherein the first through-hole is in a display area including the pixels to display the image on the display panel.

20. A display device, comprising:
a sensor device; and
a display module having a first through-hole in which the sensor device is positioned,
wherein the first through-hole has breadth that increases from one surface of the display module toward another surface of the display module, and
wherein a first portion of the one surface of the display module faces a second portion of the one surface of the display module when the display module is folded.

21. The display device of claim 20, further comprising: a cover window on the one surface of the display module.

* * * * *